United States Patent
Jeong et al.

(10) Patent No.: US 10,650,910 B2
(45) Date of Patent: May 12, 2020

(54) SEMICONDUCTOR FAULT ANALYSIS DEVICE AND FAULT ANALYSIS METHOD THEREOF

(71) Applicant: SAMSUNG ELECTRONICS CO., LTD., Suwon-si (KR)

(72) Inventors: Changwook Jeong, Hwaseong-si (KR); Sanghoon Myung, Goyang-si (KR); Min-Chul Park, Hwaseong-si (KR); Jeonghoon Ko, Hwaseong-si (KR); Jisu Ryu, Hwaseong-si (KR); Hyunjae Jang, Hwaseong-si (KR); Hyungtae Kim, Seoul (KR); Yunrong Li, Seoul (KR); Min Chul Jeon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/249,543

(22) Filed: Jan. 16, 2019

(65) Prior Publication Data

US 2019/0385695 A1 Dec. 19, 2019

(30) Foreign Application Priority Data

Jun. 18, 2018 (KR) .................. 10-2018-0069584

(51) Int. Cl.
*G11C 7/00* (2006.01)
*G11C 29/50* (2006.01)
(Continued)

(52) U.S. Cl.
CPC .......... *G11C 29/50* (2013.01); *G01R 31/2621* (2013.01); *G01R 31/275* (2013.01);
(Continued)

(58) Field of Classification Search
CPC ....... G11C 29/50; G11C 11/401; G11C 29/02; G11C 29/34
(Continued)

(56) References Cited

U.S. PATENT DOCUMENTS 4,835,458 A 5/1989 Kim
6,212,115 B1 4/2001 Jordan
(Continued)

FOREIGN PATENT DOCUMENTS

KR 10-0827440 B1 5/2008
KR 10-1744194 B1 6/2017

OTHER PUBLICATIONS

Ian Goodfellow et al., "Attacking Machine Learning With Adversarial Examples" Open AI, Feb. 24, 2017, 9 pages, retrieved from URL: <https://blog. openai. com/adversarial-example-research>.

*Primary Examiner* — Son T Dinh
(74) *Attorney, Agent, or Firm* — Sughrue Mion, PLLC

(57) ABSTRACT

A fault analysis method of a semiconductor fault analysis device is provided. The fault analysis method includes: receiving measurement data measured corresponding to a semiconductor device; generating double sampling data based on the measurement data and reference data; performing a fault analysis operation with respect to the double sampling data; classifying a fault type of the semiconductor device based on a result of the fault analysis operation; and outputting information about the fault type.

20 Claims, 22 Drawing Sheets

(51) Int. Cl.
*G11C 29/48* (2006.01)
*G11C 29/56* (2006.01)
*G01R 31/27* (2006.01)
*G01R 31/3185* (2006.01)
*G01R 31/30* (2006.01)
*G01R 31/26* (2020.01)

(52) U.S. Cl.
CPC .. *G01R 31/3004* (2013.01); *G01R 31/318511* (2013.01); *G11C 29/48* (2013.01); *G11C 29/56* (2013.01); *G11C 2029/5004* (2013.01); *G11C 2029/5006* (2013.01)

(58) Field of Classification Search
USPC .......................................................... 365/201
See application file for complete search history.

(56) References Cited

U.S. PATENT DOCUMENTS

| | | |
|---|---|---|
| 6,912,438 B2 | 6/2005 | Choo et al. |
| 7,385,864 B2 | 6/2008 | Loh et al. |
| 7,495,979 B2 | 2/2009 | Chung |
| 7,622,942 B2 | 11/2009 | Agarwal et al. |
| 7,733,719 B2 | 6/2010 | Lee |
| 7,822,561 B2 | 10/2010 | Lee |
| 8,294,485 B2 | 10/2012 | Ouyang et al. |
| 8,365,133 B2 * | 1/2013 | Chikada ................ G11C 29/10 716/101 |
| 9,147,498 B2 | 9/2015 | Bonet Zordan et al. |
| 9,244,791 B2 | 1/2016 | Hamilton |
| 9,297,850 B1 | 3/2016 | Clark et al. |
| 2008/0077376 A1 | 3/2008 | Belhaddad et al. |

* cited by examiner

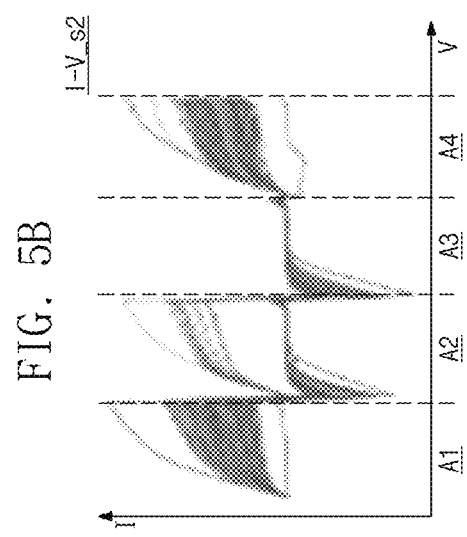
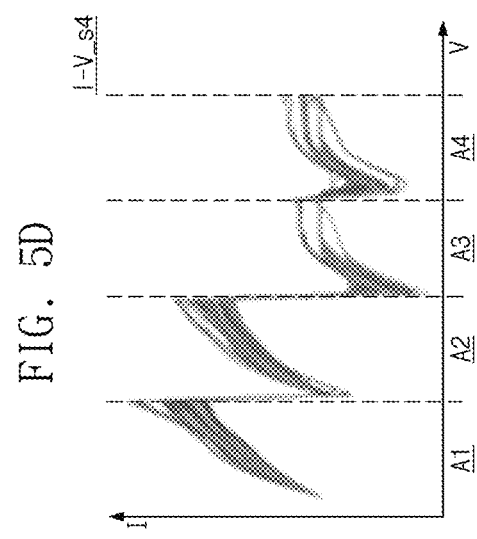
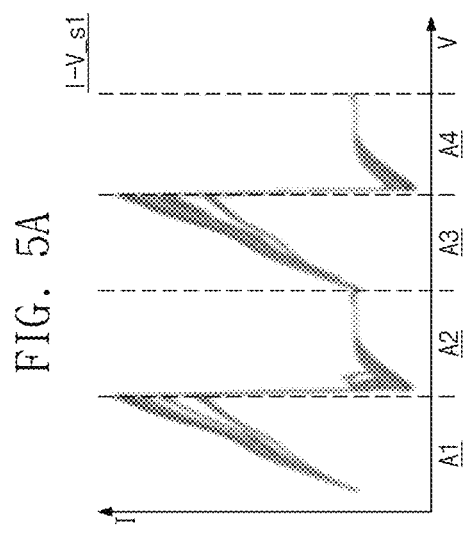
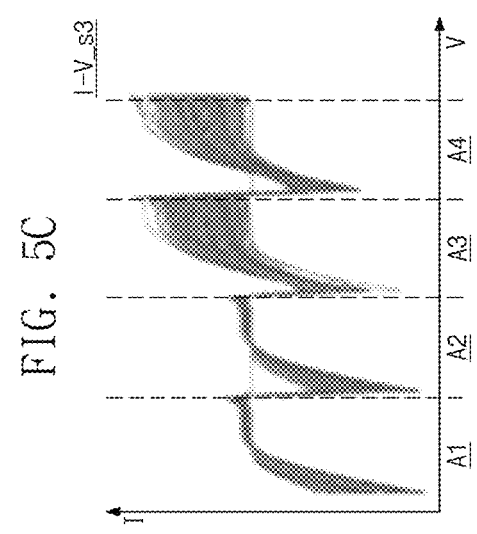

FIG. 8C
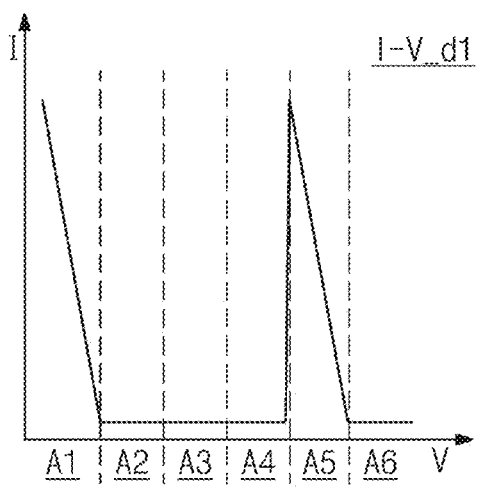
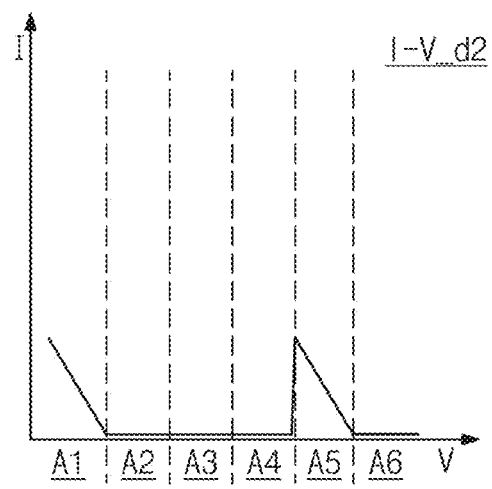
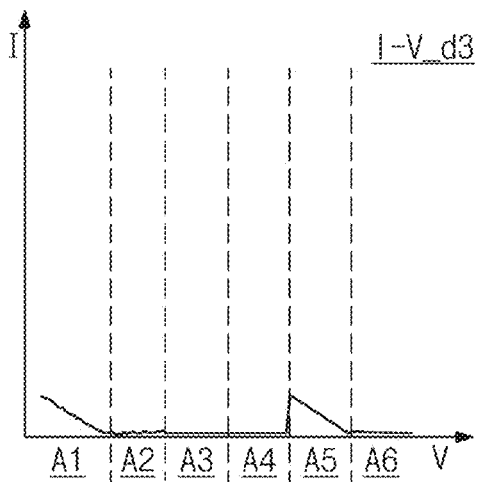
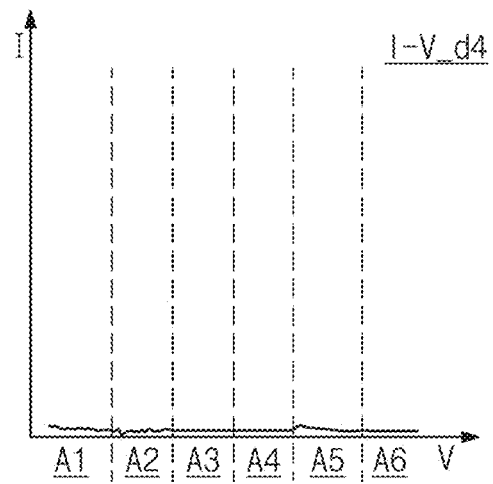

FIG. 9C
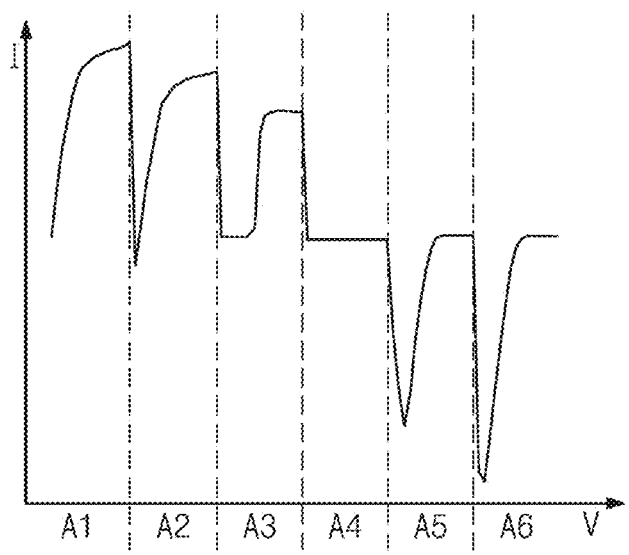
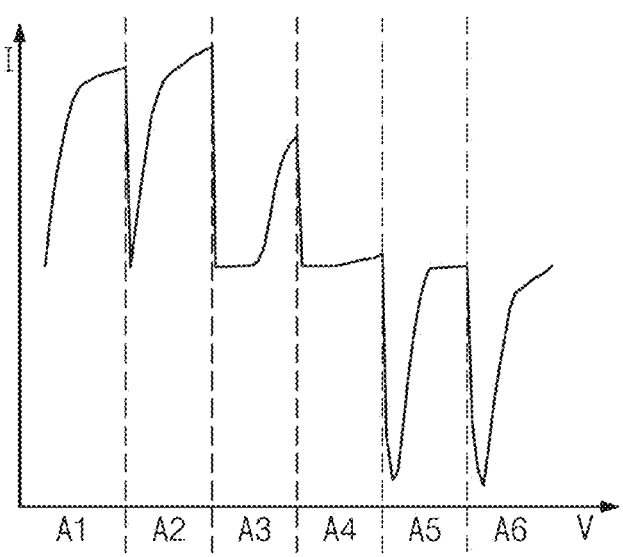

FIG. 9D
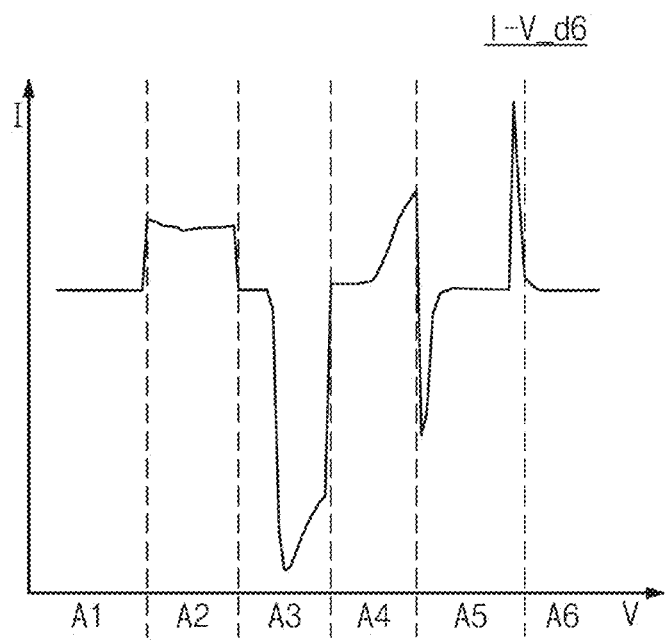
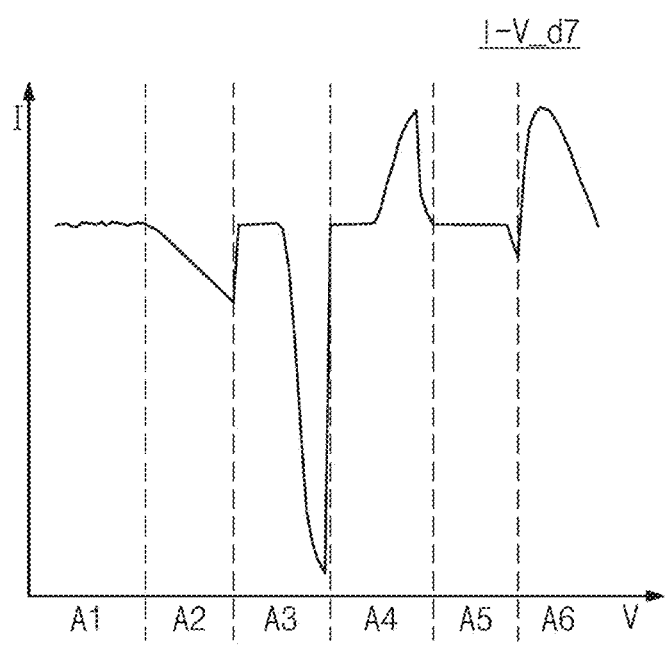

FIG. 15
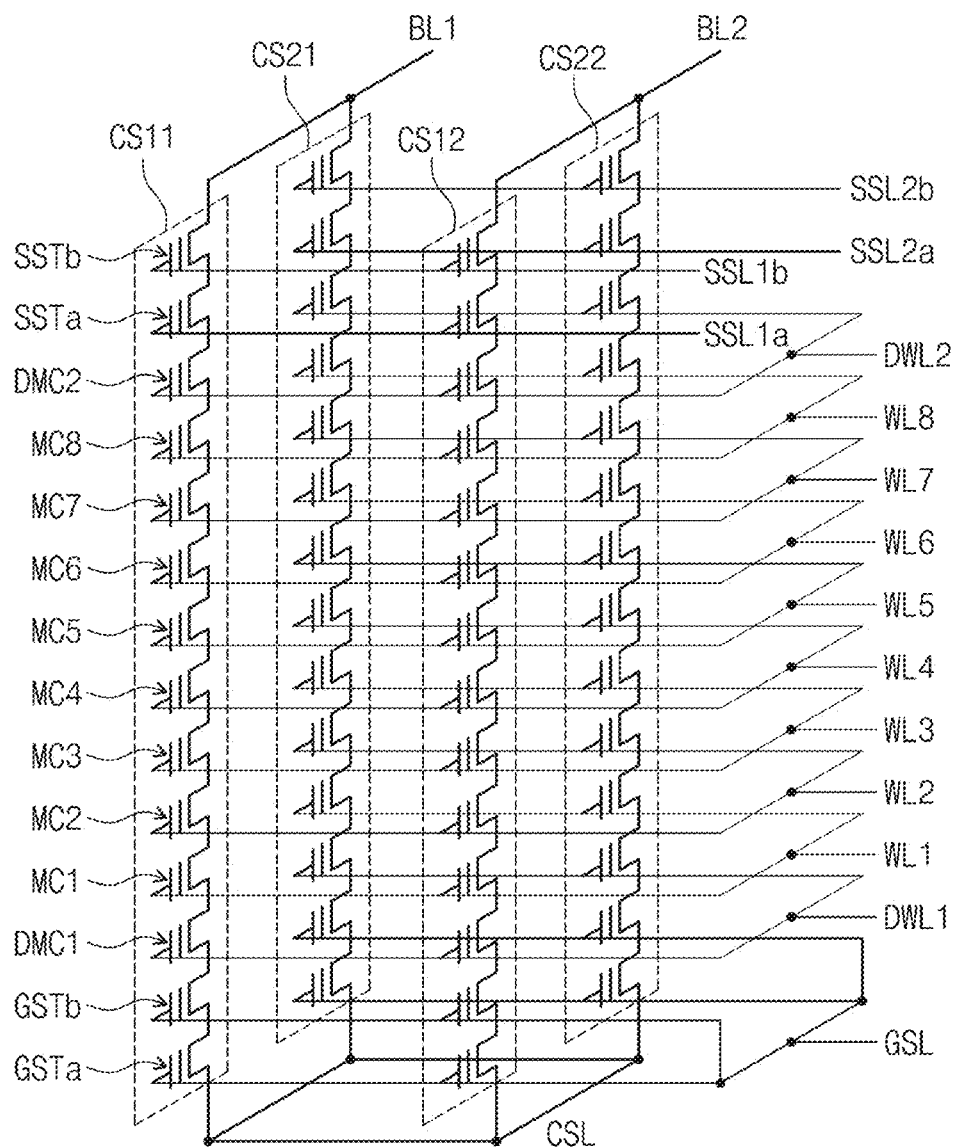
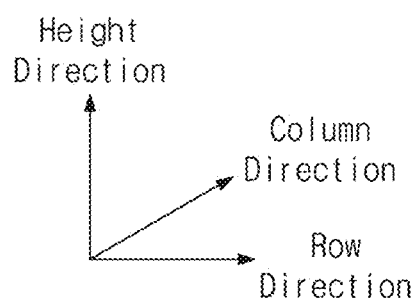

SEMICONDUCTOR FAULT ANALYSIS DEVICE AND FAULT ANALYSIS METHOD THEREOF

CROSS-REFERENCE TO RELATED APPLICATION

This application claims priority under 35 U.S.C. § 119 to Korean Patent Application No. 10-2018-0069584 filed on Jun. 18, 2018, in the Korean Intellectual Property Office, the disclosure of which is incorporated by reference herein in its entirety.

BACKGROUND

Methods and apparatuses consistent with example embodiments relate to a semiconductor device, and more particularly, to a semiconductor fault analysis device and a fault analysis method thereof.

A semiconductor device is manufactured through various processes. As semiconductor design technologies develop, the number of processes for manufacturing a semiconductor device, complexity of each process, and the degree of integration are increasing. As such, various defects or faults may occur in the semiconductor manufacturing process.

A semiconductor fault should be identified as soon as possible so that the cause of the fault may be identified and remedied. The semiconductor fault may be classified based on an electrical measured value (e.g., a current-voltage characteristic) of a semiconductor device.

SUMMARY

Example embodiments provide a semiconductor fault analysis method with improved reliability and a fault analysis method thereof.

According to an aspect of an exemplary embodiment, there is provided a fault analysis method of a semiconductor fault analysis device, the fault analysis method including: receiving measurement data measured from a semiconductor device included a semiconductor wafer; generating double sampling data based on the measurement data and reference data; performing a fault analysis operation with respect to the double sampling data; classifying a fault type of the semiconductor device based on a result of the fault analysis operation; and outputting information about the fault type.

According to an aspect of an exemplary embodiment, there is provided a semiconductor fault analysis device including: a measurement device configured to measure electrical data from a semiconductor device included in a semiconductor wafer and to output the measured electrical data as measurement data; a first double sampler configured to generate double sampling data based on the measurement data and reference data; a classifier configured to perform a fault analysis operation based on the double sampling data and classify a fault type of the semiconductor device based on a result of the fault analysis operation; and an analyzer configured to analyze and output a classification result based on the fault type.

According to an aspect of an exemplary embodiment, there is provided a semiconductor fault analysis device including: a measurement device configured to receive electrical data from a semiconductor device included in a semiconductor wafer and to output the electrical data as measurement data; a simulator configured to generate a simulation for each of a plurality of fault types of the semiconductor device and to measure simulation data based on the simulation; a classifier configured to generate a training model by performing pre-training based on the simulation data, perform a fault analysis operation with respect to the measurement data by using the training model, and classify a fault type of the semiconductor device based on the fault analysis operation; and an analyzer configured to analyze and output a classification result based on the fault type.

BRIEF DESCRIPTION OF THE FIGURES

The above and other objects and features will become more apparent from the following description taken in conjunction with the accompanying drawings.

FIGS. 5A to 5D are diagrams illustrating simulation data generated from each of first to fourth fault types of FIGS. 4A to 4D.

FIGS. 8A to 8C are diagrams for describing an operation of a semiconductor fault analysis device of FIG. 6.

FIGS. 9A to 9D are diagrams for describing an operation of a semiconductor fault analysis device of FIG. 6.

FIG. 15 is a diagram illustrating any one of various semiconductor devices manufactured on a semiconductor wafer according to an example embodiment.

DETAILED DESCRIPTION

Below, example embodiments will be described in detail with reference to the drawings. In the following description, known configurations may be omitted. In addition, the following example embodiments may be modified into various other forms, and the scope of the technical spirit of the present disclosure is not limited to the following examples. Rather, these example embodiments are provided so that the present disclosure will be more thorough and complete, and will fully convey the scope of the technical spirit of the present disclosure to those skilled in the art.

Figure 1:
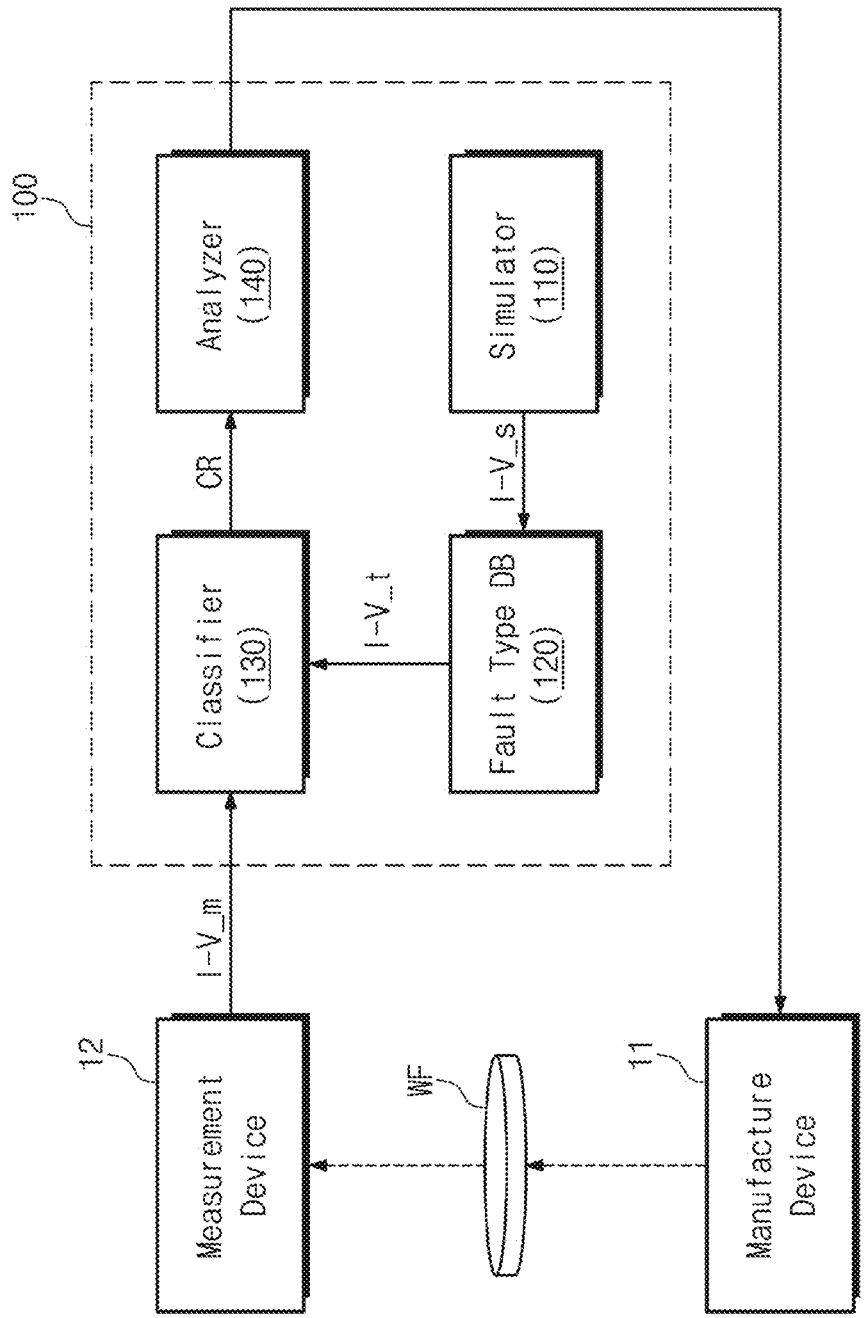
FIG. 1 is a block diagram illustrating a semiconductor fault analysis system according to an example embodiment.

FIG. 1 is a block diagram illustrating a semiconductor fault analysis system according. Referring to FIG. 1, a semiconductor fault analysis system 10 may include a semiconductor wafer WF, a manufacture device 11, a measurement device 12, and a semiconductor fault analysis device 100.

The semiconductor wafer WF may be used as a substrate of a semiconductor device. For example, the semiconductor wafer WF may include a material having a semiconductor characteristic, such as silicon (Si) or gallium arsenic (GaAs). The manufacture device 11 may perform various processes for manufacturing the semiconductor wafer WF. For example, the manufacture device 11 may form various semiconductor patterns on the semiconductor wafer WF by performing various processes on the semiconductor wafer WF such as an etching process, a deposition process, and a planarization process.

In an example embodiment, the semiconductor wafer WF having the semiconductor patterns formed by the manufacture device 11 may include a logic circuit performing various logical operations, or a memory device such as a static random access memory (SRAM), a dynamic RAM (DRAM), a flash memory, or a magnetic RAM (MRAM). Below, for convenience, it is described that the semiconductor wafer WF includes a pattern for an SRAM device. That is, the semiconductor wafer WF may include a plurality of SRAM devices.

The measurement device 12 may measure various information from the SRAM devices formed on the semiconductor wafer WF. For example, the measurement device 12 may measure current-voltage data I-V_m (hereinafter referred to as "measurement data") from the SRAM devices formed on the semiconductor wafer WF. The measurement data I-V_m may be information indicating a current-voltage characteristic of each of a plurality of memory cells included in the SRAM device or a current-voltage characteristic of each semiconductor element included in each memory cell. The measurement data I-V_m will be more fully described below.

The semiconductor fault analysis device 100 may include a simulator 110, a fault type database 120, a classifier 130, and an analyzer 140. In an example embodiment, the semiconductor fault analysis device 100 may perform fault analysis on the semiconductor wafer WF based on an artificial intelligence (AI) algorithm such as a convolutional neural network (CNN), a deep neural network, or machine learning. Below, for convenience of description, it is assumed that the semiconductor fault analysis device 100 performs an analysis operation based on a deep neural network algorithm.

The classifier 130 of the semiconductor fault analysis device 100 may perform a fault analysis operation based on the deep neural network algorithm. For example, the classifier 130 may receive the measurement data I-V_m from the measurement device 12. By performing the fault analysis operation on the received measurement data I-V_m, the classifier 130 may determine whether the SRAM device included in the semiconductor wafer WF is normal or faulty, and may determine a fault type. Below, for convenience of description, an operation of determining whether the SRAM device included in the semiconductor wafer WF is normal or faulty and an operation of determining a fault type is called a "fault analysis operation".

For example, by extracting characteristics of the measurement data I-V_m and performing the deep neural network algorithm on the extracted characteristics, the classifier 130 of the semiconductor fault analysis device 100 may classify whether the measurement data I-V_m corresponds to a normal state or a faulty state and may determine a fault type. In an example embodiment, characteristics extracted by the classifier 130 may include a magnitude, a slope, an inflection point, and a waveform shape of a signal associated with each of a plurality of areas of the measurement data I-V_m, but example embodiments are not limited thereto.

In an example embodiment, the classifier 130 may generate a training model through pre-training for the purpose of performing an analysis operation based on the deep neural network algorithm. The pre-training refers to the process of modeling a fault type associated with the SRAM device of the semiconductor wafer WF based on data (e.g., a current-voltage characteristic) associated with various fault types. The classifier 130 may perform the analysis operation on the measurement data I-V_m based on the training model generated by the pre-training.

In the case where data for the pre-training, for example, current-voltage data or information associated with various fault types is insufficient, an accurate training model may not be generated, and thus, reliability of an operation of the classifier 130 may become worse. That is, sufficient data for the pre-training may be required to make the operation of the classifier 130 reliable.

In general, data for pre-training may be obtained by performing various semiconductor manufacturing processes and performing fault analysis operations on various semiconductor wafers. However, the pre-training data may be insufficient due to various factors such as a change of a manufacturing process, a characteristic change of a semiconductor wafer, and a specification change of a semiconductor device.

In an example embodiment, even in the case where data for pre-training are insufficient, the semiconductor fault analysis device 100 may secure the reliability of the fault analysis operation. For example, the simulator 110 of the semiconductor fault analysis device 100 may generate a simulation associated with each of various fault types which may occur in the SRAM device included in the semiconductor wafer WF, and may generate or output current-voltage data I-V_s (hereinafter referred to as "simulation data") based on the generated simulation. In an example embodiment, the simulator 110 may be implemented with hardware or software, which operates based on a common open source analog circuit simulation such as SPICE (Simulation Program with Integrated Circuit Emphasis), or with a combination of the hardware and the software, but example embodiments are not limited thereto.

The simulation data I-V_s may be stored to the fault type database 120. The fault type database 120 may be a storage medium which stores various simulation data I-V_s generated by the simulator 110. The fault type database 120 may output the stored simulation data I-V_s as training data I-V_t.

The classifier 130 may generate a training model by performing the pre-training based on the training data I-V_t from the fault type database 120. For example, as described above, the fault type database 120 may include the simulation data I-V_s of various fault types provided from the simulator 110 and may provide the simulation data I-V_s as the training data I-V_t to the classifier 130. The classifier 130 may generate the training model by performing the pre-training based on the training data I-V_t. That is, the classifier 130 may perform the pre-training based on pieces of information about various fault types generated by the simulator 110, and thus, the reliability of the training model may be improved.

The classifier 130 may perform the fault analysis operation on the measurement data I-V_m from the measurement device 12 based on the generated training model and may determine a type of the measurement data I-V_m (e.g., a normal state, a faulty state, or a fault type if faulty). The classifier 130 may output the determined type as a classification result CR.

The analyzer 140 may perform various operations based on the classification result CR from the classifier 130. For example, the analyzer 140 may be configured to identify a cause of a classified fault based on the classification result CR. Information about the fault cause identified by the analyzer 140 may be provided to the manufacture device 11, and the manufacture device 11 may remove the fault cause by controlling various process steps based on the information about the fault cause. The above-described operation in which the analyzer 140 utilizes the classification result CR is only an example, and example embodiments are not limited thereto.

As described above, the semiconductor fault analysis device 100 may automatically classify a type of a fault, which occurs in various semiconductor devices included in the semiconductor wafer WF, based on the deep neural network algorithm. Accordingly, a time taken to analyze a fault of the semiconductor wafer WF may decrease. Also, because the simulator 110 may generate the simulation data I-V_s associated with various fault types and the classifier 130 may perform the pre-training based on the simulation data I-V_s, even though the training model for the deep neural network algorithm is absent or data for the pre-training are insufficient, the reliability of the semiconductor fault analysis device 100 may be secured.

Figure 2:
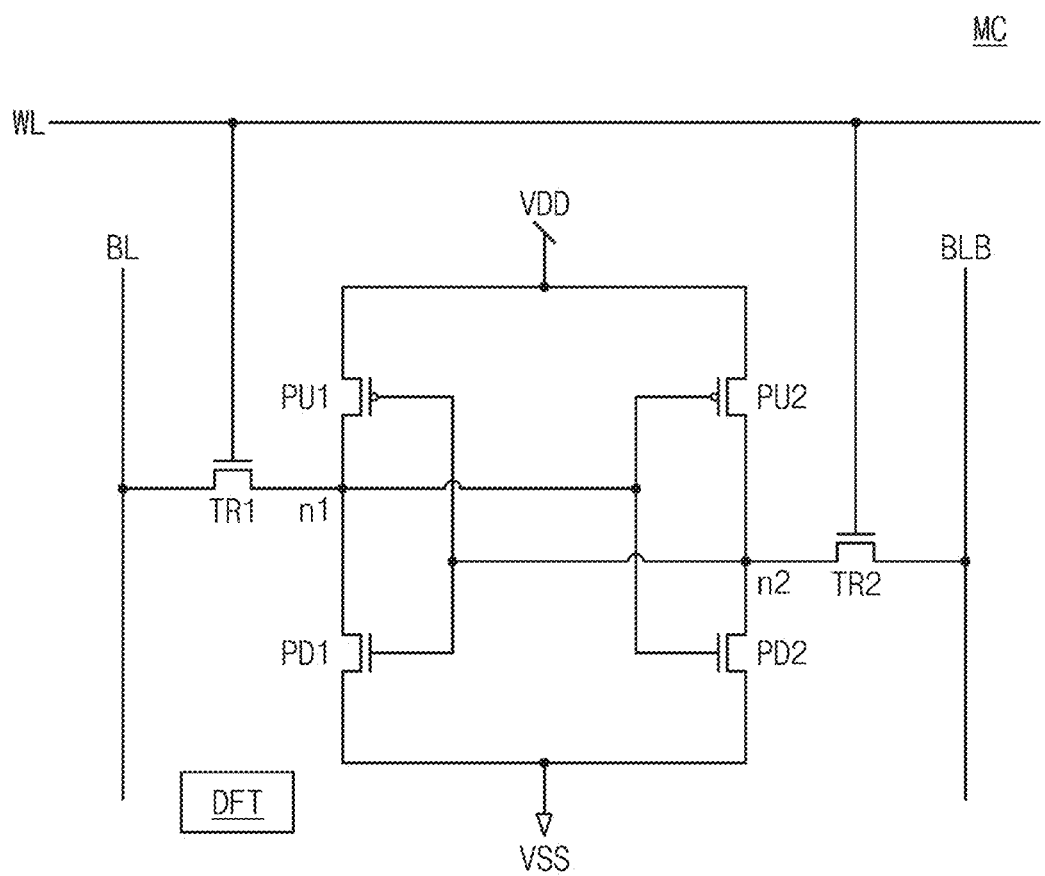
FIG. 2 is a circuit diagram illustrating a memory cell for describing an example embodiment.

FIG. 2 is a circuit diagram illustrating a memory cell for describing an example embodiment. Below, to describe technical features easily, it is assumed that the semiconductor wafer WF includes a plurality of SRAM devices and the semiconductor fault analysis device 100 performs fault analysis on an SRAM device. However, example embodiments are not limited thereto.

For brevity of illustration and for convenience of description, one memory cell MC included in the SRAM device is illustrated in FIG. 2. However, example embodiments are not limited thereto, and each of the plurality of SRAM devices included in the semiconductor wafer WF may include a plurality of memory cells similar to the memory cell MC illustrated in FIG. 2.

Referring to FIG. 2, the memory cell MC may include first and second transistors TR1 and TR2, first and second pull-up transistors PU1 and PU2, and first and second pull-down transistors PD1 and PD2.

The first transistor TR1 is connected between a bit line BL and a first node n1, and a second transistor TR2 is connected between a complementary bit line BLB and a second node n2. The first and second transistors TR1 and TR2 operate based on a signal on a word line WL.

The first pull-up transistor PU1 has a source terminal connected to a power supply voltage VDD, a drain terminal connected to the first node n1, and a gate terminal connected to the second node n2. The first pull-down transistor PD1 has a source terminal connected to the first node n1, a drain terminal connected to a ground voltage VSS, and a gate terminal connected to the second node n2.

The second pull-up transistor PU2 has a source terminal connected to the power supply voltage VDD, a drain terminal connected to the second node n2, and a gate terminal connected to the first node n1. The second pull-down transistor PD2 has a source terminal connected to the second node n2, a drain terminal connected to the ground voltage VSS, and a gate terminal connected to the first node n1.

As described above, the memory cell MC may have a 6-transistor structure. However, example embodiments are not limited thereto, and the memory cell MC may be implemented in various structures.

The memory cell MC may include a design for test (DFT) terminal. The measurement device 12 may be configured to measure the measurement data I-V_m through the DFT terminal of the memory cell MC.

Figure 3:
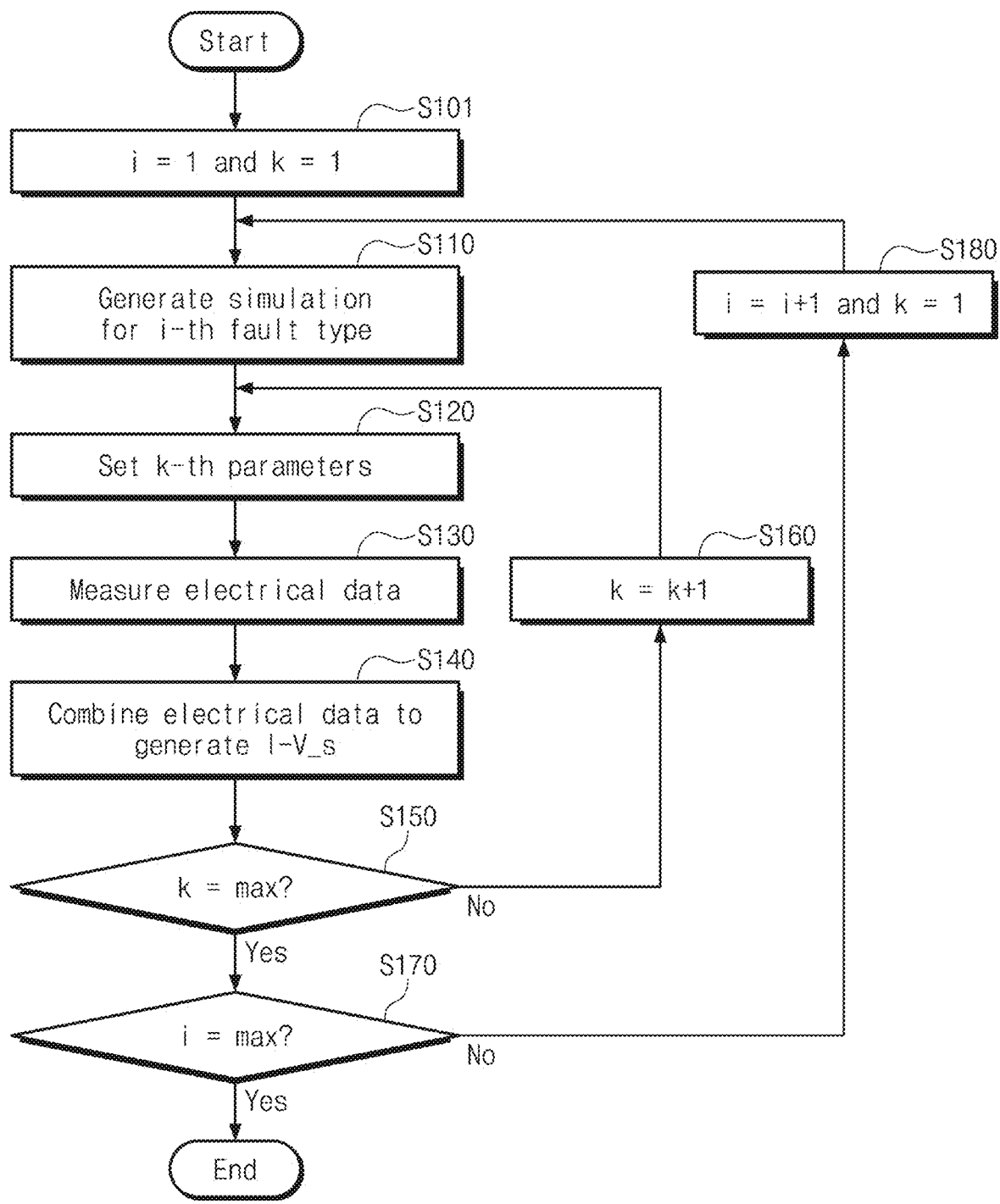
FIG. 3 is a flowchart illustrating an operation of a simulator of FIG. 1.

FIG. 3 is a flowchart illustrating an operation of a simulator of FIG. 1. Referring to FIGS. 1 to 3, in operation S101, the simulator 110 may set variables "i" and "k" to "1". The variables "i" and "k" set in operation S101 are only for describing an iterative operation of the simulator 110, and example embodiments are not limited thereto.

In operation S110, the simulator 110 may generate a simulation for an i-th fault type. Due to issues on various processes or characteristics of elements, in an SRAM device, for example, in the memory cell MC of FIG. 2, various fault types such as a short circuit between the first node n1 and the ground voltage VSS, a short circuit between the first pull-up transistor PU1 and the power supply voltage VDD, and a short circuit between the first and second nodes n1 and n2 may occur. The simulator 110 may generate a simulation for a first fault type (because "i" is "1" in operation S101) of a plurality of fault types.

In operation S120, the simulator 110 may generate k-th parameters. For example, various elements (e.g., in FIG. 2, the transistors TR1, TR2, PU1, PU2, PD1, and PD2, or resistances, capacitances, and inductances of signal lines) may be set to have particular physical values. As physical values of various elements are set differently, simulation results (i.e., simulation data) may be obtained differently. As such, the simulator 110 may set the physical values associated with the elements of the simulation as first parameters (because "k" is "1" in operation S101).

In operation S130, the simulator 110 may measure electrical data from the generated simulation. For example, the simulator 110 may measure electrical data, for example, a current-voltage curve of each element from the simulation generated through operation S110 and operation S120. In an example embodiment, a plurality of electrical data may be measured with regard to one simulation.

In operation S140, the simulator 110 may combine the pieces of measured electrical data to generate the simulation data I-V_s. For example, the simulation generated through operation S110 and operation S120 may be a simulation associated with one memory cell MC. A plurality of electrical data (i.e., a plurality of current-voltage data) may be required to classify a fault type associated with one memory cell MC. In other words, one fault type may be classified based on a plurality of current-voltage data. A plurality of current-voltage data measured from one simulation may be combined to one simulation data I-V_s. In this case, one simulation data I-V_s may be unit data for classifying a fault type associated with one simulation (or one memory cell MC).

In operation S150, the simulator 110 may determine whether the variable "k" is a maximum value. In the case where the variable "k" is not a maximum value, in operation S160, the variable "k" may be increased by "1", and operation S120 to operation S140 may be repeatedly performed.

In the case where a determination result of operation S150 indicates that the variable "k" is a maximum value, in operation S170, the simulator 110 may determine whether the variable "i" is a maximum value. In the case where the variable "i" is not a maximum value, in operation S180, the variable "k" is reset to "1", and the variable "i" is increased by "1" (i.e., i=i+1). Afterwards, the simulator 110 may repeatedly perform operation S110 to operation S180.

As described above, by repeatedly performing operation S110 to operation S180, the simulator 110 may set a plurality of parameters with regard to each of a plurality of simulations, thus generating the simulation data I-V_s.

Through the iterative operation of the simulator 110, the simulation data I-V_s associated with each of various kinds of fault types may be obtained, and the obtained simulation data I-V_s may be stored to the fault type database 120.

For convenience of description, the operations of FIG. 3 are described as being divided, but example embodiments are not limited thereto. For example, particular operations may be performed at the same time or may be performed differently from the illustrated sequence.

FIGS. 4A to 4D are diagrams for describing some of various fault types capable of occurring in a memory cell of an SRAM device. FIGS. 5A to 5D are diagrams illustrating simulation data generated from each of first to fourth fault types of FIGS. 4A to 4D. For brevity of illustration, in FIGS. 4A to 4D, simulations associated with various fault types are illustrated in the form of a circuit diagram.

Figure 4A:
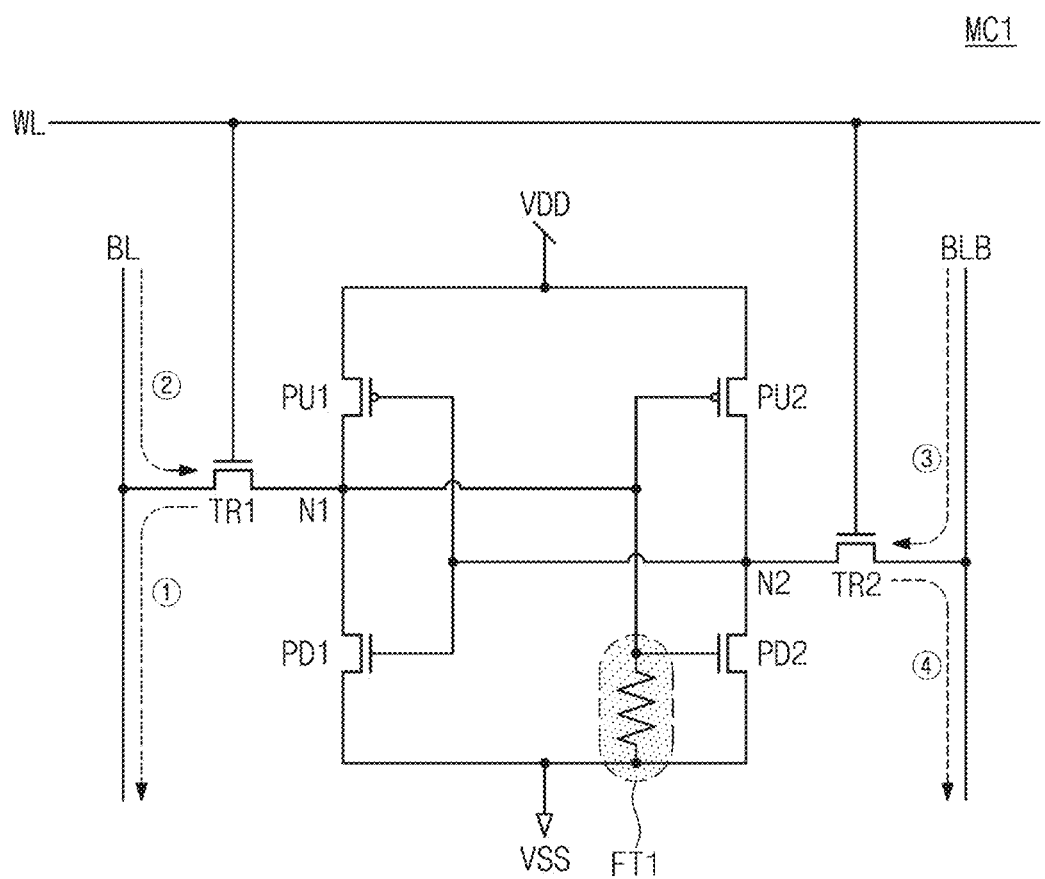
FIGS. 4A to 4D are diagrams for describing some of various fault types capable of occurring in a memory cell of an SRAM device.

As illustrated in FIG. 4A, a first memory cell MC1 may include a first fault FT1. The first fault FT1 may be a fault due to a short circuit between the first node n1 and the ground voltage VSS, and is illustrated as a resistor connected between the first node n1 and the ground voltage VSS. The simulator 110 may generate a simulation associated with the first fault FT1 based on a circuit diagram of the first memory cell MC1, as illustrated in FIG. 4A.

The simulator 110 may set a parameter of each element, in the generated simulation associated with the first fault FT1. For example, even though faults (e.g., the first fault FT1) of the same kind occur, the simulation data I-V_s may vary with a change or magnitude of a value of the resistor expressed as the first fault FT1. The simulator 110 may measure the simulation data I-V_s while changing parameters of the elements, in the generated simulation associated with the first fault FT1. As such, a plurality of simulation data I-V_s associated with various parameters may be generated even with respect to faults of the same kind. For example, first simulation data I-V_s1 illustrated in FIG. 5A may be generated from the simulation associated with the first memory cell MC1 including the first fault FT1.

The first simulation data I-V_s1 may have a form in which various current-voltage curves of the first memory cell MC1 are combined. For example, in the first simulation data I-V_s1 of FIG. 5A, a first area A1 indicates a current ① flowing from the first transistor TR1 to the bit line BL depending on a voltage change of the word line WL, a second area A2 indicates a current ② flowing from the bit line BL to the first transistor TR1 depending on the voltage change of the word line WL, a third area A3 indicates a current ③ flowing from the complementary bit line BLB to the second transistor TR2 depending on the voltage change of the word line WL, and a fourth area A4 indicates a current ④ flowing from the second transistor TR2 to the complementary bit line BLB depending on the voltage change of the word line WL.

That is, one simulation data (e.g., the first simulation data I-V_s1) may have a form in which a plurality of current-voltage curves are combined. The reason is that various current-voltage curves are required to classify one fault type. In an example embodiment, a form of the simulation data I-V_s and a form of the measurement data I-V_m (refer to FIG. 1) may be configured to have the same form.

Figure 4B:
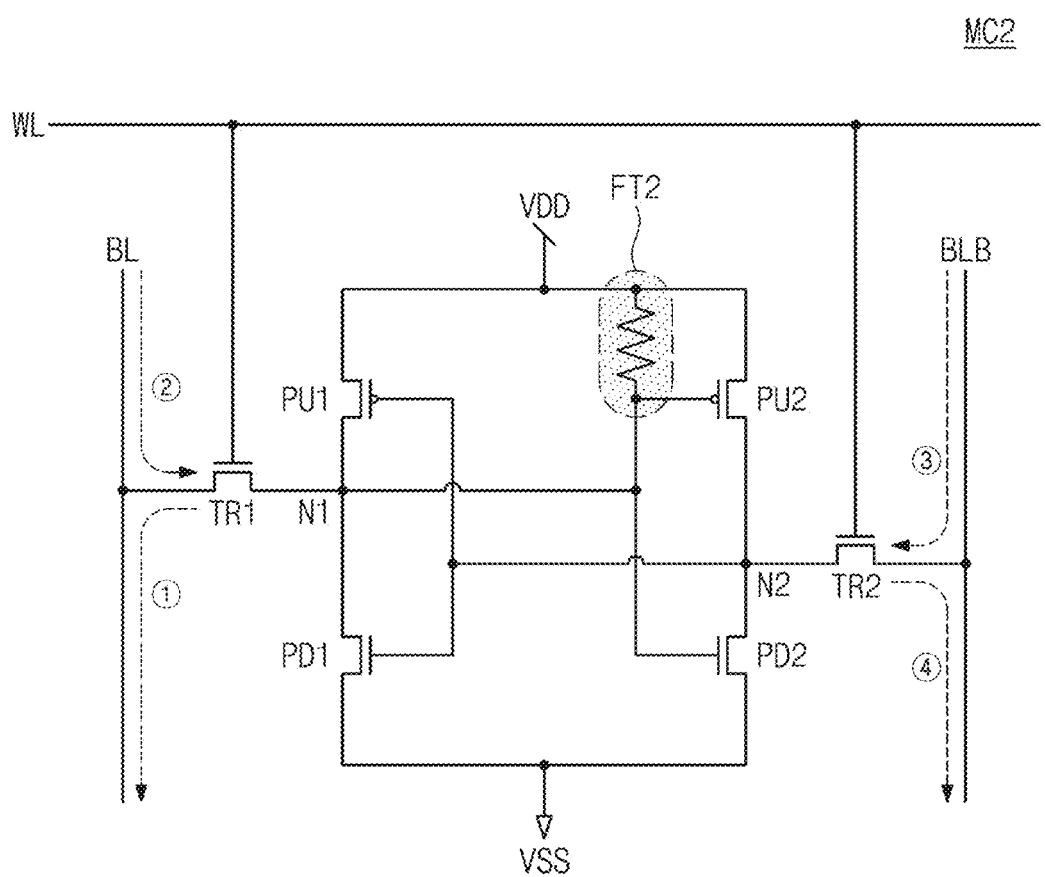
Figure 4C:
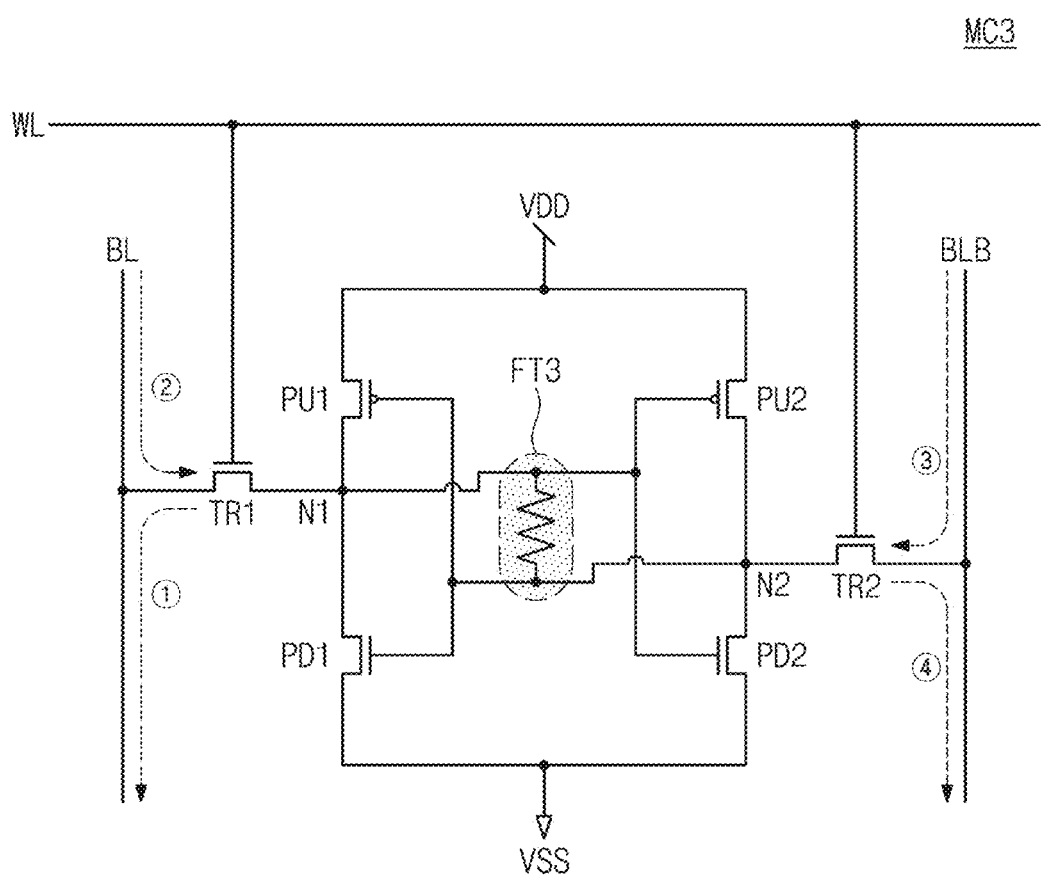
Figure 4D:
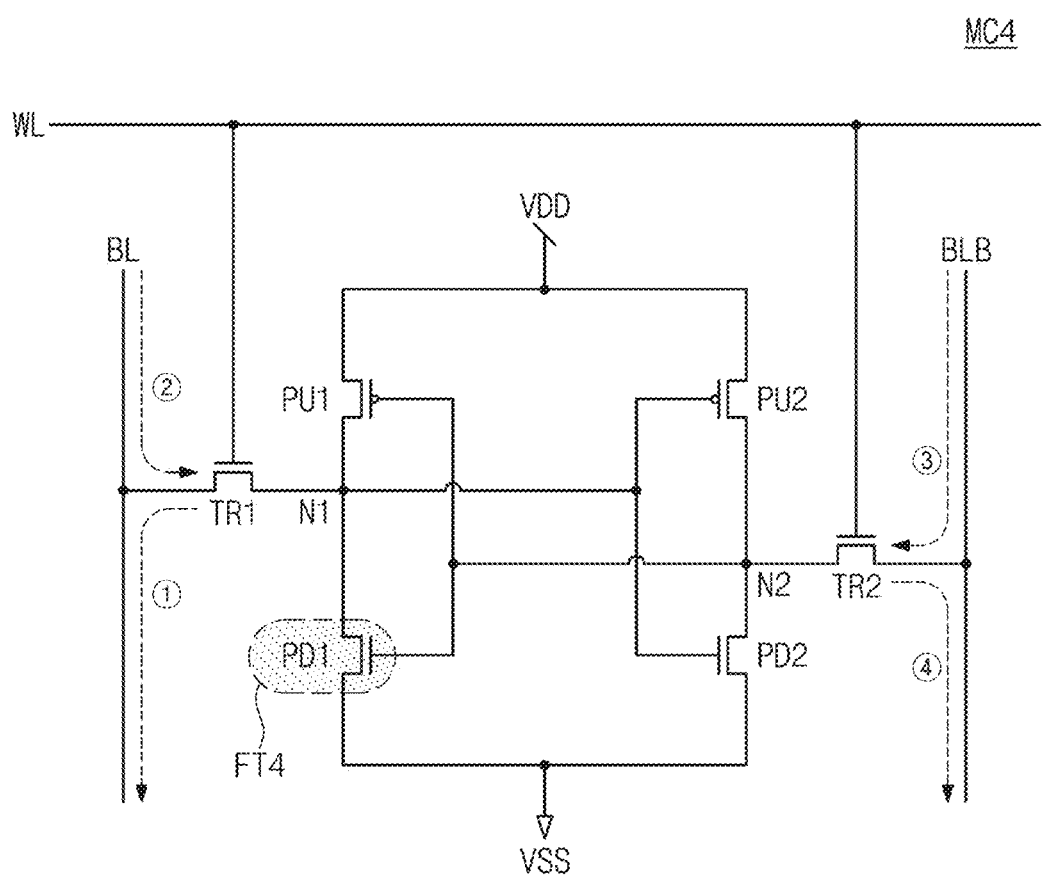

FIG. 4B shows a second memory cell MC2 including a second fault FT2. The second fault FT2 may be a fault due to a short circuit between the first node n1 and the power supply voltage VDD. FIG. 4C shows a third memory cell MC3 including a third fault FT3. The third fault FT3 may be a fault due to a short circuit between the first node n1 and the second node n2. FIG. 4D shows a fourth memory cell MC4 including a fourth fault FT4. The fourth fault FT4 may be a fault due to a change in strength of the first pull-down transistor PD1.

As described with reference to FIG. 4A, the simulator 110 may generate simulations including the second, third, and fourth faults FT2, FT3, and FT4 of FIGS. 4B, 4C, and 4D, may change various parameters, and may generate second to fourth simulation data I-V_s2 to I-V_s4, respectively. In an example embodiment, each of the second to fourth simulation data I-V_s2 to I-V_s4 may be divided into the first to fourth areas A1 to A4, and the first to fourth areas A1 to A4 indicate current-voltage curves associated with different paths or elements as described with reference to FIGS. 4A and 5A.

In an example embodiment, a description is given as each of the second to fourth simulation data I-V_s2 to I-V_s4 is divided into the first to fourth areas A1 to A4, but example embodiments are not limited thereto. For example, the number of current-voltage curves included in the simulation data I-V_s may be variously changed.

In an example embodiment, the first to fourth faults FT1 to FT4 described with reference to FIGS. 4A to 4D are exemplary, and fault types associated with one memory cell may further exist in addition to the first to fourth faults FT1 to FT4. For example, fault types associated with one memory cell may further include various fault types such as a fault due to a change in strength of the pull-up transistors PU1 and PU2 or the pull-down transistors PD1 and PD2, a fault due to a short circuit between the second node n2 and the ground voltage VSS, a fault due to a short circuit between the second node n2 and the power supply voltage VDD, and a fault due to a leakage current of the first node, and the simulator 110 may generate simulation data associated with each of the fault types, as illustrated in FIGS. 5A to 5D.

As described above, the simulator 110 may generate a simulation associated with each of various fault types, and may generate the simulation data I-V_s associated with the simulation thus generated. The generated simulation data I-V_s may be used for the pre-training of the classifier 130. Accordingly, even though a training model for the deep neural network algorithm is absent or data for the pre-training is insufficient, the reliability of the semiconductor fault analysis device 100 may be secured.

Figure 6:
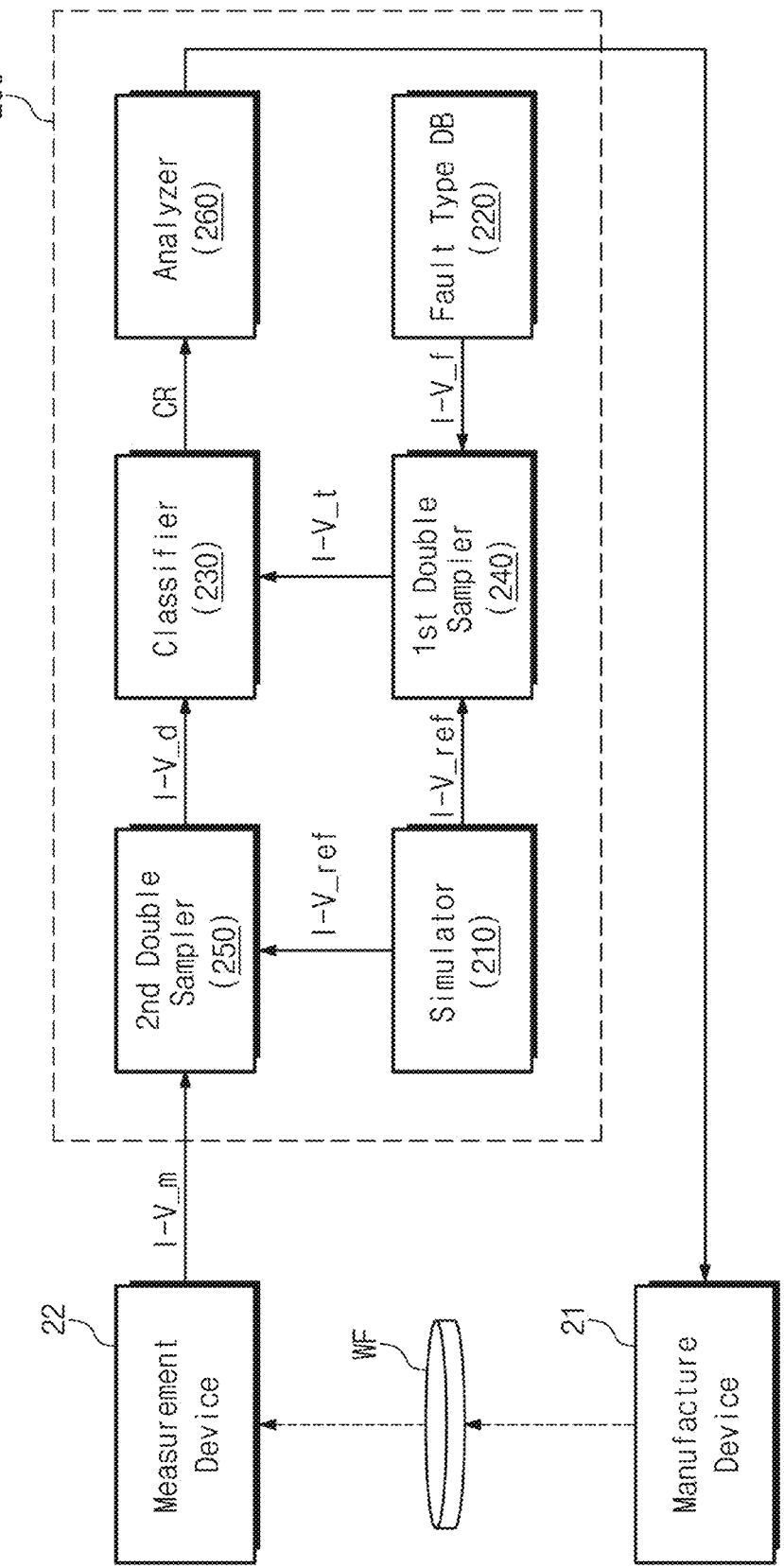
FIG. 6 is a block diagram illustrating a semiconductor fault analysis system according to an example embodiment.

FIG. 6 is a block diagram illustrating a semiconductor fault analysis system according to an example embodiment. Referring to FIG. 6, a semiconductor fault analysis system 20 may include the semiconductor wafer WF, a manufacture device 21, a measurement device 22, and a semiconductor fault analysis device 200. The semiconductor wafer WF, the manufacture device 21, and the measurement device 22 are described with reference to FIG. 1, and thus, additional description will be omitted to avoid redundancy.

The semiconductor fault analysis device 200 may perform the fault analysis operation based on the deep neural network as described with reference to FIG. 1. In this case, the semiconductor fault analysis device 200 may generate double sampling data I-V_d based on the measurement data I-V_m from the measurement device 22 and separate reference data I-V_ref, and may perform the fault analysis operation based on the generated double sampling data I-V_d. In this case, the accuracy (i.e., reliability) of the fault type classification operation may be improved.

In detail, the semiconductor fault analysis device 200 may include a simulator 210, a fault type database 220, a classifier 230, first and second double samplers 240 and 250, and an analyzer 260.

The simulator 210 may generate a simulation associated with a normal memory cell MC, and may generate the reference data I-V_ref from the generated simulation. That is, the reference data I-V_ref may be electrical data measured from the normal memory cell MC. The reference data I-V_ref generated from the simulator 210 may be provided to the first and second double samplers 240 and 250.

For the pre-training of the classifier 230, the fault type database 220 may include fault data I-V_f associated with various fault types.

The first double sampler 240 may receive the reference data I-V_ref from the simulator 210 and may receive the fault data I-V_f from the fault type database 220. The first double sampler 240 may output training data I-V_t based on the received reference data I-V_ref and the received fault data I-V_f. The classifier 230 may generate a training model by performing the pre-training based on the training data I-V_t from the first double sampler 240. That is, the training data I-V_t may be data for the pre-training of the classifier 230 and may be a difference between the fault data I-V_f and the reference data I-V_ref.

The second double sampler 250 may output the double sampling data I-V_d based on the reference data I-V_ref from the simulator 210 and the measurement data I-V_m from the measurement device 22. In an example embodiment, the double sampling data I-V_d may be a difference between the measurement data I-V_m and the reference data I-V_ref. V_ref. In an example embodiment, the first and second double samplers 240 and 250 are illustrated as separate blocks, but example embodiments are not limited thereto. For example, the first and second double samplers 240 and 250 may be implemented with one function block.

The classifier 230 may execute the deep neural network algorithm on the double sampling data I-V_d from the second double sampler 250. That is, the classifier 230 may perform the fault analysis operation on the semiconductor wafer WF from which the measurement data I-V_m (i.e., data being the basis of the double sampling data I-V_d) are measured.

In an example embodiment, there may be obtained various forms of measurement data I-V_m depending on various fault types of the SRAM device existing on the semiconductor wafer WF. In this case, even though first measurement data and second measurement data are associated with different fault types, forms or waveforms of the first measurement data and the second measurement data may be similar. Under this condition, in the case where a classifier may perform the fault analysis operation directly on the first measurement data and the second measurement data, because the first measurement data and the second measurement data are similar, the classifier may classify the first measurement data and the second measurement data as the same fault type.

Alternatively, due to various factors such as a change of a manufacturing environment and a mechanical failure of a measurement device, various noises may be present in the measurement data I-V_m, allowing the classifier to fail to perform the fault analysis operation normally.

In contrast, according to an example embodiment, the classifier 230 performs the analysis operation on the double sampling data I-V_d based on the measurement data I-V_m and the reference data I-V_ref, not only based on measurement data. In this case, as described above, even though the first measurement data and the second measurement data are similar, first double sampling data based on the first measurement data and the reference data I-V_ref and second double sampling data based on the second measurement data and the reference data I-V_ref may be clearly distinguished from each other. Accordingly, even though measurement data of similar forms are collected with regard to different fault types, the classifier 230 may classify fault types accurately. That is, the classification consistency may be improved with regard to a fault type of the classifier 230. A way to improve the classification consistency, according to an example embodiment, will be more fully described with reference to FIGS. 8A to 9D.

Figure 7:
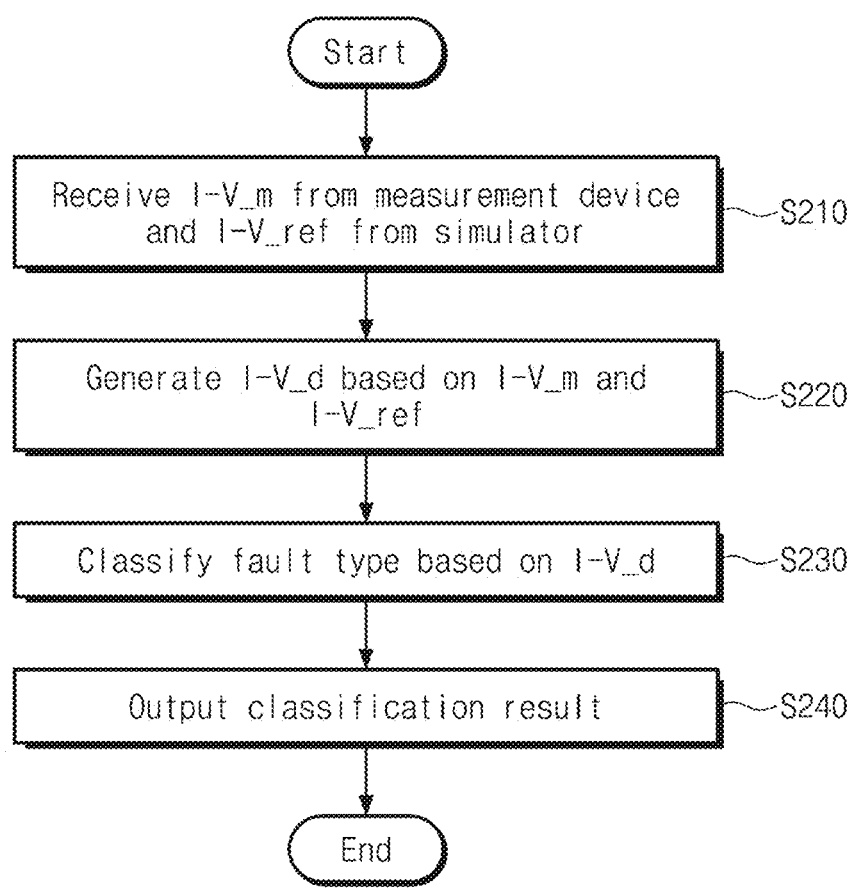
FIG. 7 is a flowchart illustrating an operating method of a semiconductor fault analysis device of FIG. 6.

FIG. 7 is a flowchart illustrating an operating method of a semiconductor fault analysis device of FIG. 6. For convenience of description, it is assumed that the semiconductor fault analysis device 200 of FIG. 6 is in a state where a training model is generated by performing the pre-training based on the training data I-V_t (i.e., a difference between the reference data I-V_ref and the fault data I-V_f) from the first double sampler 240.

Referring to FIGS. 6 and 7, in operation S210, the semiconductor fault analysis device 200 may receive the measurement data I-V_m from the measurement device 22 and may generate the reference data I-V_ref through the simulator 210. As described above, the measurement data I-V_m may be electrical data measured from the semiconductor wafer WF, and the reference data I-V_ref may be electrical data generated from a simulation generated by the simulator 210 with regard to a normal memory cell.

In operation S220, the semiconductor fault analysis device 200 may generate the double sampling data I-V_d based on the measurement data I-V_m and the reference data I-V_ref. For example, the second double sampler 250 of the semiconductor fault analysis device 200 may generate the double sampling data I-V_d by performing double sampling on the measurement data I-V_m and the reference data I-V_ref. That is, the double sampling data I-V_d may be a difference between the measurement data I-V_m and the reference data I-V_ref.

In operation S230, the semiconductor fault analysis device 200 may perform the fault analysis operation based on the generated double sampling data I-V_d. For example, as described above, the classifier 230 may generate a training model by performing the pre-training based on the training data I-V_t from the first double sampler 240. The classifier 230 may classify a fault type associated with the double sampling data I-V_d by executing the deep neural network algorithm with respect to the double sampling data I-V_d based on the generated training model.

In operation S240, the semiconductor fault analysis device 200 may output the classification result CR to an external device. For example, the analyzer 260 of the semiconductor fault analysis device 200 may perform various operations based on the classification result CR from the classifier 230. For example, the analyzer 260 may provide the manufacture device 21 with fault information corresponding to the classification result CR or may notify the manager of the fault information through a separate output device (e.g., a display device). In an example embodiment, the manufacture device 21 may perform a separate control for removing a fault based on the information from the analyzer 260, or the manager which perceives the fault information may take separate measures for removing the fault.

Figure 8A:
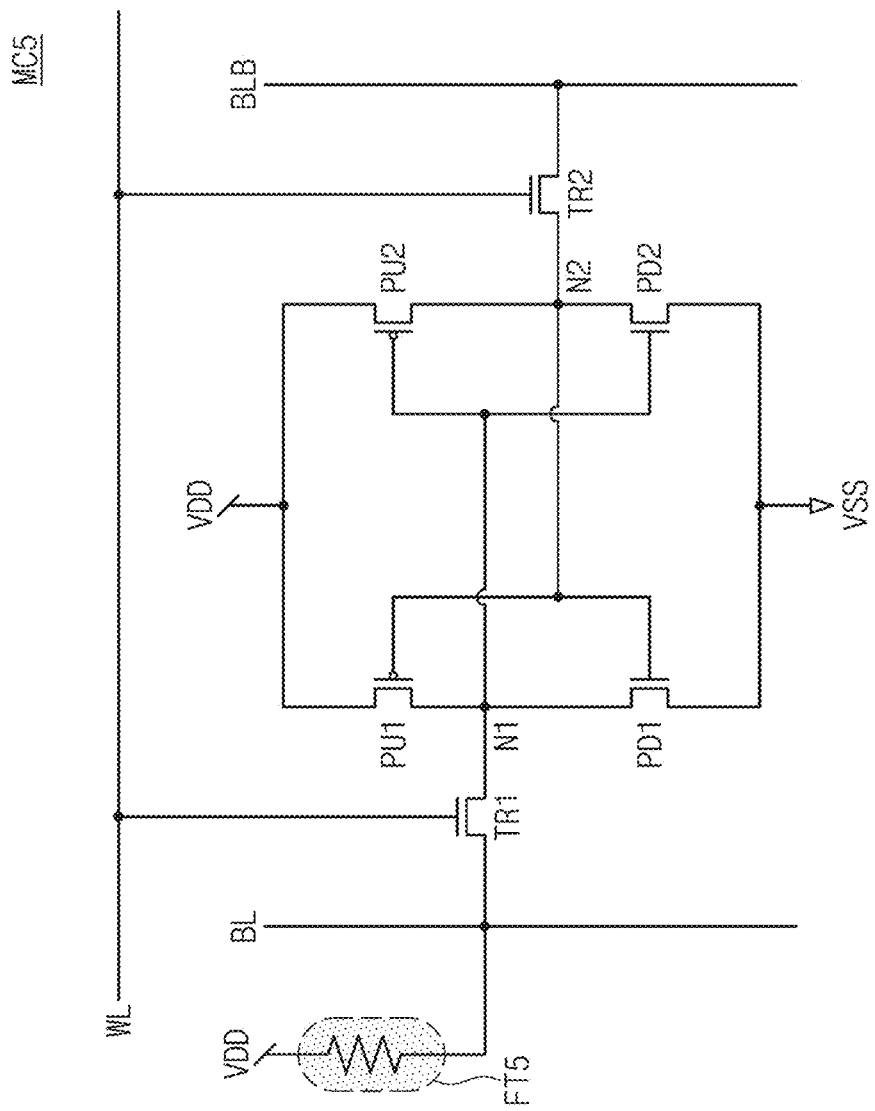
Figure 8B:
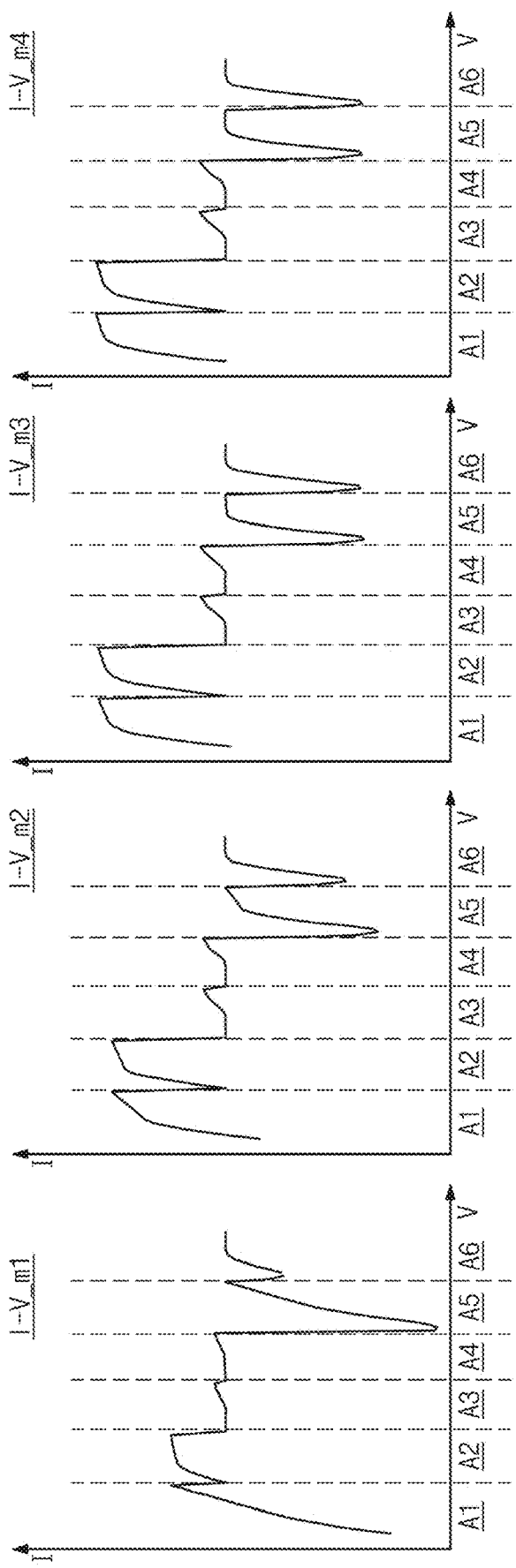
Figure 9A:
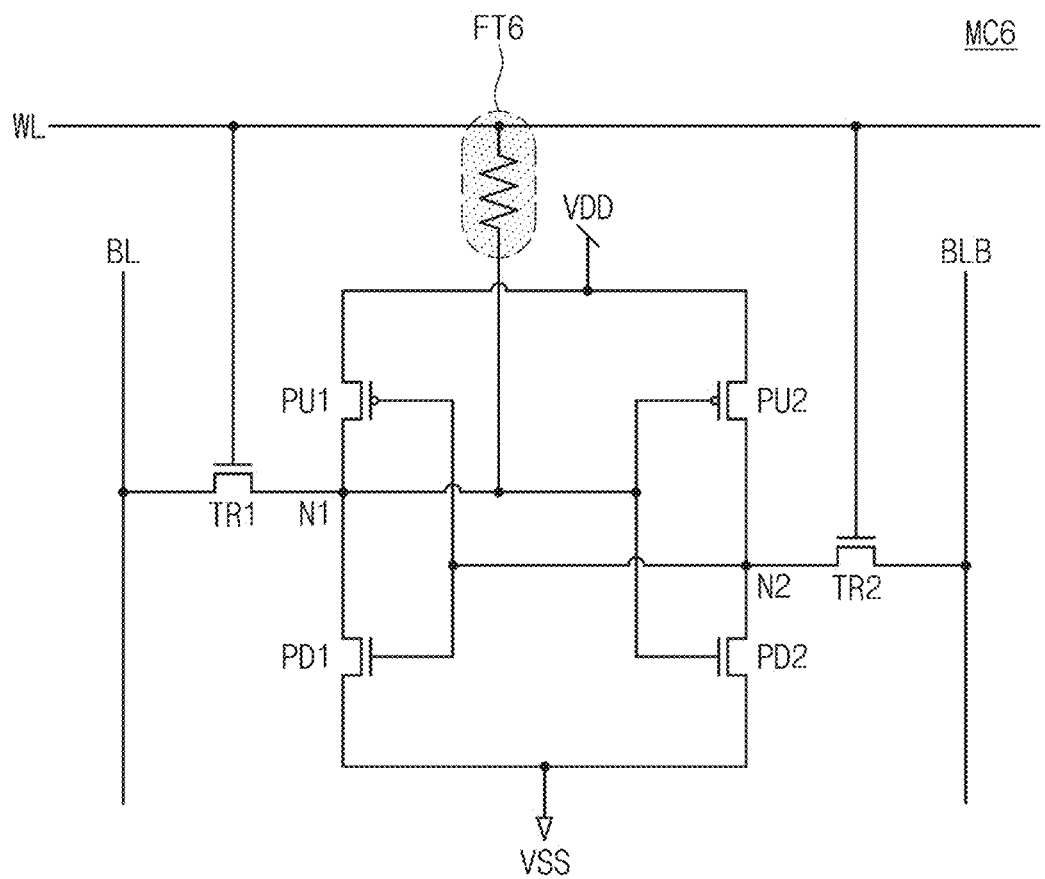
Figure 9B:
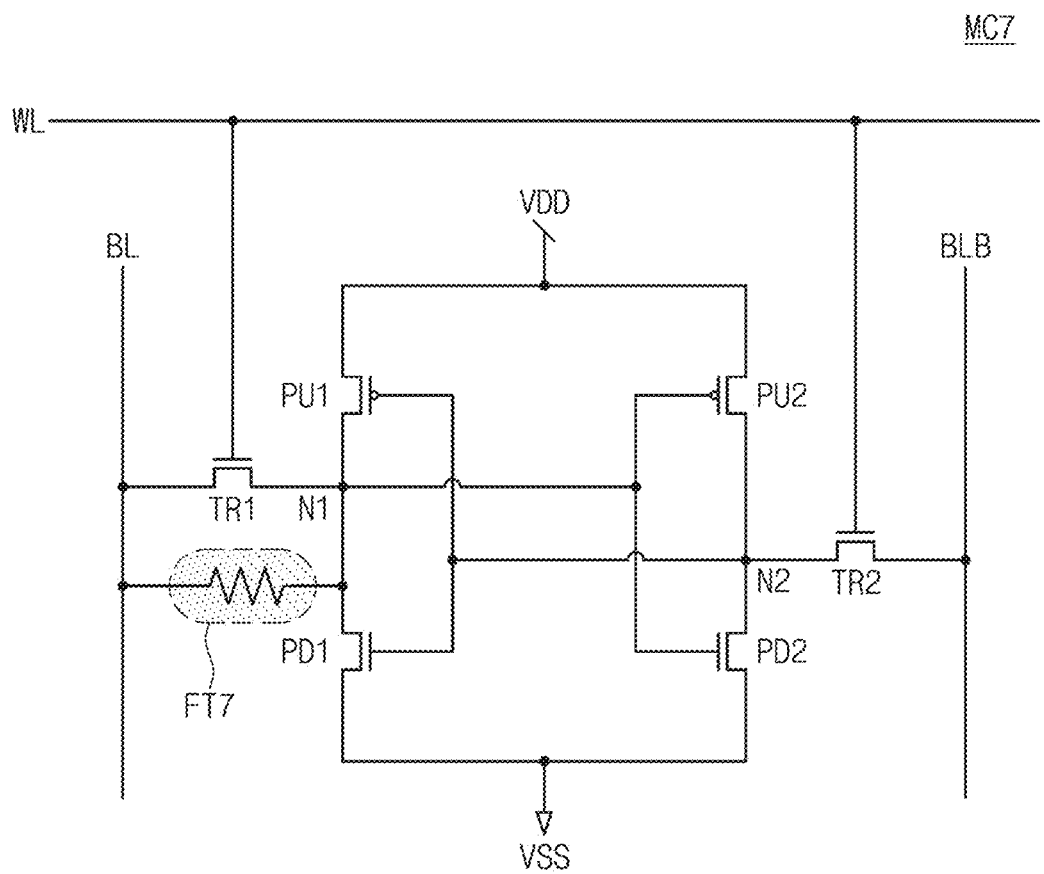

FIGS. 8A to 8C are diagrams for describing an operation of a semiconductor fault analysis device of FIG. 6. How the consistency for one fault type is improved with regard to the semiconductor fault analysis device 200 according to an example embodiment will be described with reference to FIGS. 8A to 8C.

Referring to FIGS. 6 and 8A to 8C, a fifth memory cell MC5 may be included in the semiconductor wafer WF. The fifth memory cell MC5 may include a fifth fault FT5. The fifth fault FT5 may be a fault due to a short circuit between the bit line BL and the power supply voltage VDD.

As described above, measurement data to be measured by the measurement device 22 may vary with a value of a resistor expressed as the fifth fault FT5. For example, as illustrated in FIG. 8B, in the case where the resistor expressed as the fifth fault FT5 has a first resistance value, first measurement data I-V_m1 may be measured; in the case where the resistor expressed as the fifth fault FT5 has a second resistance value, second measurement data I-V_m2 may be measured; and in the case where the resistor expressed as the fifth fault FT5 has a third resistance value, third measurement data I-V_m3 may be measured. In an example embodiment, measurement data measured from a normal memory cell may be identical to fourth measurement data I-V_m4.

As illustrated in FIG. 8B, some of the first to fourth measurement data I-V_m1 to -V_m4 may have similar waveforms. For example, a waveform or a data value of the third measurement data I-V_m3 may be similar to a waveform or a data value of the fourth measurement data I-V_m4. That is, in the case where the classifier 230 may perform the fault analysis operation directly on the measurement data, the classifier 230 may classify both the third measurement data I-V_m3 and the fourth measurement data I-V_m4 as the same fault type or as a normal state.

However, as described above, the third measurement data I-V_m3 are data (i.e., measurement data measured from a faulty memory cell) corresponding to the case where the resistor expressed as the fifth fault FT5 has the third resistance value, and the fourth measurement data I-V_m4 are measurement data measured from a normal memory cell. That is, in the case where the classifier 230 may perform the fault analysis operation directly on measurement data, classification consistency may become worse.

In contrast, according to an example embodiment, the classifier 230 may improve classification consistency by performing the analysis operation on double sampling data as illustrated in FIG. 8C. For example, first double sampling data I-V_d1 of FIG. 8C may be a difference between first measurement data I-V_m1 of FIG. 8B and the reference data I-V_ref, second double sampling data I-V_d2 of FIG. 8C may be a difference between second measurement data I-V_m2 of FIG. 8B and the reference data I-V_ref, third double sampling data I-V_d3 of FIG. 8C may be a difference between third measurement data I-V_m3 of FIG. 8B and the reference data I-V_ref, and fourth double sampling data I-V_d4 of FIG. 8C may be a difference between fourth measurement data I-V_m4 of FIG. 8B and the reference data I-V_ref.

As illustrated in FIG. 8C, each of the first to fourth double sampling data I-V_d1 to I-V_d4 may be clearly distinguished from each other. For example, the fourth double sampling data I-V_d4 is substantially constant throughout the plurality of areas A1 to A6, while each of the first to third double sampling data I-V_d1 to I-V_d3 may change in the first and fifth areas A1 and A5. Also, the first to fourth double sampling data I-V_d1 to I-V_d3 may be different in magnitude.

That is, even though measurement data associated with a particular fault type is similar to measurement data associated with a normal state, because the semiconductor fault analysis device 200 according to example embodiments performs the fault analysis operation by using double sampling data based on the measurement data and the reference data, not by using the measurement data, the classification consistency of the fault type may be improved.

FIGS. 9A to 9D are diagrams for describing an operation of a semiconductor fault analysis device of FIG. 6. How the consistency for different fault types is improved with regard to the semiconductor fault analysis device 200 according to an example embodiment will be described with reference to FIGS. 9A to 9D.

Referring to FIGS. 6 and 9A to 9D, the semiconductor wafer WF may include a sixth memory cell MC6 including a sixth fault FT6 and a seventh memory cell MC7 including a seventh fault FT7.

The sixth fault FT6 may indicate a fault due to a short circuit between the first node n1 and the word line WL, and the seventh fault FT7 may indicate a fault due to a short circuit between the first node n1 and the bit line BL.

The measurement device 22 may measure and output sixth measurement data I-V_m6 (refer to FIG. 9C) from the sixth memory cell MC6, and may measure and output seventh measurement data I-V_m7 (refer to FIG. 9C) from the seventh memory cell MC7.

Even though the sixth and seventh memory cells MC6 and MC7 include different fault types FT6 and FT7, as illustrated in FIG. 9C, waveforms or data values of the sixth and seventh measurement data I-V_m6 and I-V_m7 respectively measured from the sixth and seventh memory cells MC6 and MC7 may be similar. That is, as in the above description, in the case where a classifier may perform an analysis operation directly on measurement data, the sixth and seventh measurement data I-V_m6 and I-V_m7 may be classified as the same fault type.

In contrast, according to an example embodiment, the classifier 230 may perform the fault analysis operation on sixth double sampling data I-V_d6 and seventh double sampling data I-V_d7 as illustrated in FIG. 9D. The sixth double sampling data I-V_d6 may be a difference between the sixth measurement data I-V_m6 and the reference data I-V_ref, and the seventh double sampling data I-V_d7 may be a difference between the seventh measurement data I-V_m7 and the reference data I-V_ref.

As illustrated in FIG. 9D, waveforms of second and sixth areas A2 and A6 of the sixth double sampling data I-V_d6 and waveforms of second and sixth areas A2 and A6 of the seventh double sampling data I-V_d7 may be clearly distinguished from each other. That is, even though the sixth and seventh measurement data I-V_m6 and I-V_m7 have similar forms, because the sixth and seventh double sampling data I-V_d6 and I-V_d7 are clearly distinguished from each other, the classifier 230 may classify the sixth and seventh measurement data I-V_m6 and I-V_m7 into different fault types by performing the fault analysis operation on the sixth and seventh double sampling data I-V_d6 and I-V_d7. Therefore, the consistency may be improved with regard to a fault analysis of the classifier 230.

Figure 10:
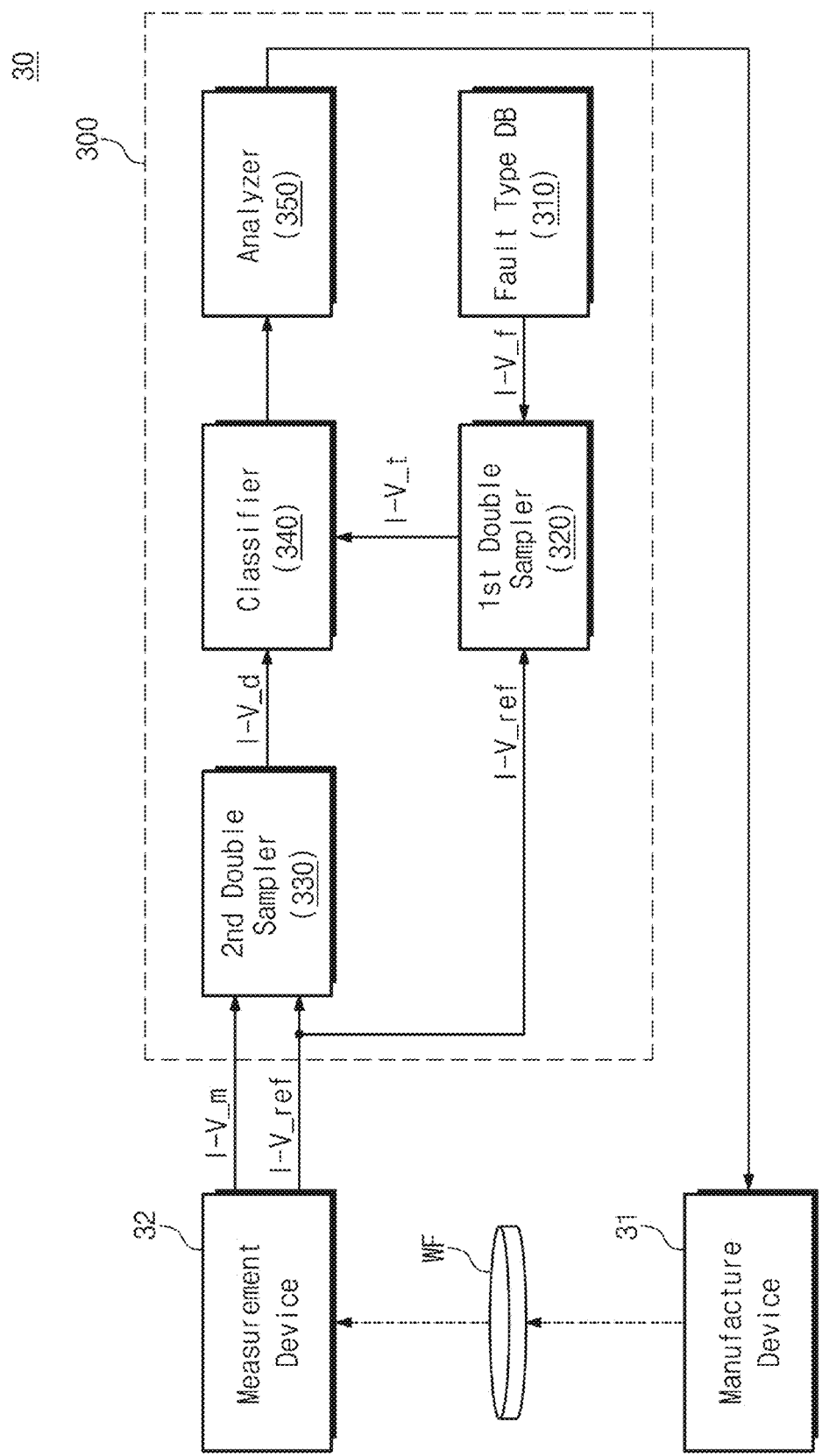
FIG. 10 is a block diagram illustrating a semiconductor fault analysis system according to an example embodiment.

FIG. 10 is a block diagram illustrating a semiconductor fault analysis system according to an example embodiment. Referring to FIG. 10, a semiconductor fault analysis system 30 may include the semiconductor wafer WF, a manufacture device 31, a measurement device 32, and a semiconductor fault analysis device 300. The semiconductor fault analysis device 300 may include a fault type database 310, a first double sampler 320, a second double sampler 330, a classifier 340, and an analyzer 350. The semiconductor wafer WF, the manufacture device 31, the fault type database 310, the classifier 340, and the analyzer 350 are described above, and thus, additional description will be omitted to avoid redundancy.

Unlike the semiconductor fault analysis device 200 of FIG. 6, the semiconductor fault analysis device 300 of FIG. 10 may be configured to receive the reference data I-V_ref from the measurement device 32. For example, the semiconductor wafer WF may include a plurality of SRAM devices, and each of the SRAM devices may be in a normal state or in a faulty state.

The semiconductor fault analysis device 300 may determine data, which correspond to a normal state, from among measurement data measured by the measurement device 32 through separate preliminary evaluation. The measurement data determined as being in the normal state may be used as the reference data I-V_ref.

The first double sampler 320 and the second double sampler 330 may respectively generate the training data I-V_t and the double sampling data I-V_d by using the reference data I-V_ref from the measurement device 32. The classifier 340 may generate a training model by performing the pre-training based on the generated training data I-V_t, and may perform an analysis operation on the generated double sampling data I-V_d.

Figure 11:
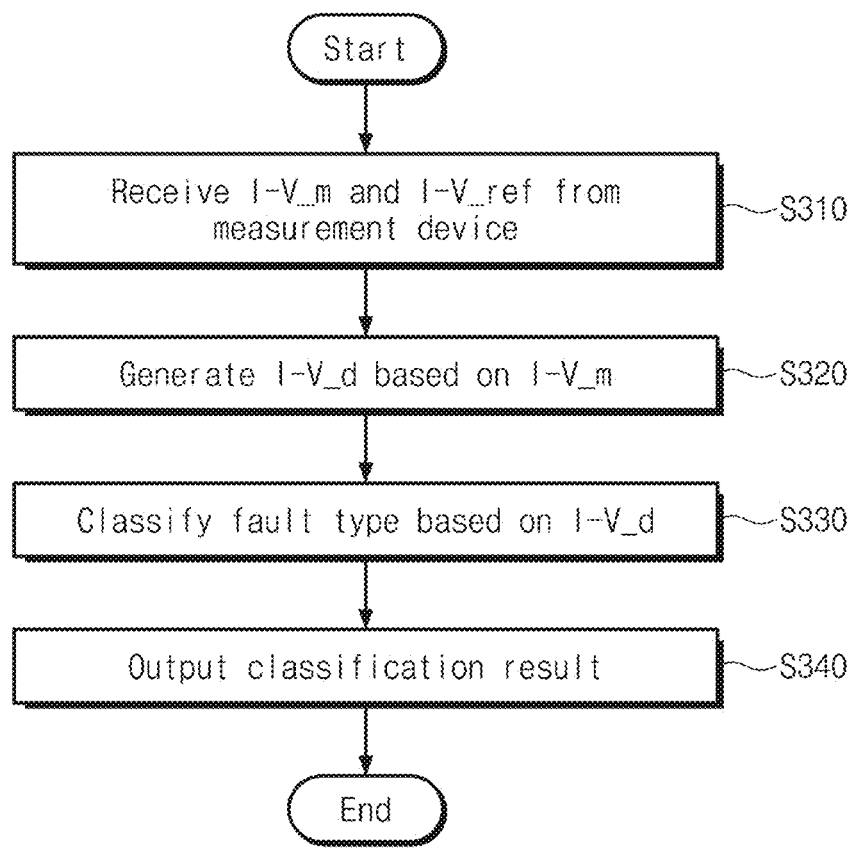
FIG. 11 is a flowchart illustrating an operation of a semiconductor fault analysis device of FIG. 10.

FIG. 11 is a flowchart illustrating an operation of a semiconductor fault analysis device of FIG. 10. Referring to FIGS. 10 and 11, in operation S310, the semiconductor fault analysis device 300 may receive the measurement data I-V_m and the reference data I-V_ref from the measurement device 32.

Afterwards, the semiconductor fault analysis device 300 may perform operation S320 and operation S340. Operation S320 and operation S340 may be similar to operation S220 and operation S240 of FIG. 7, and thus, additional description will be omitted to avoid redundancy.

As described above, as the semiconductor fault analysis device 300 receives the reference data I-V_ref from the measurement device 32 and generates the double sampling data I-V_d based on the reference data I-V_ref, an error occurring in the measurement device 32 or a noise occurring in measurement data due to a change of various ambient environments may be cancelled out in the double sampling data I-V_d. Accordingly, the reliability of the semiconductor fault analysis device 300 may be improved.

Figure 12:
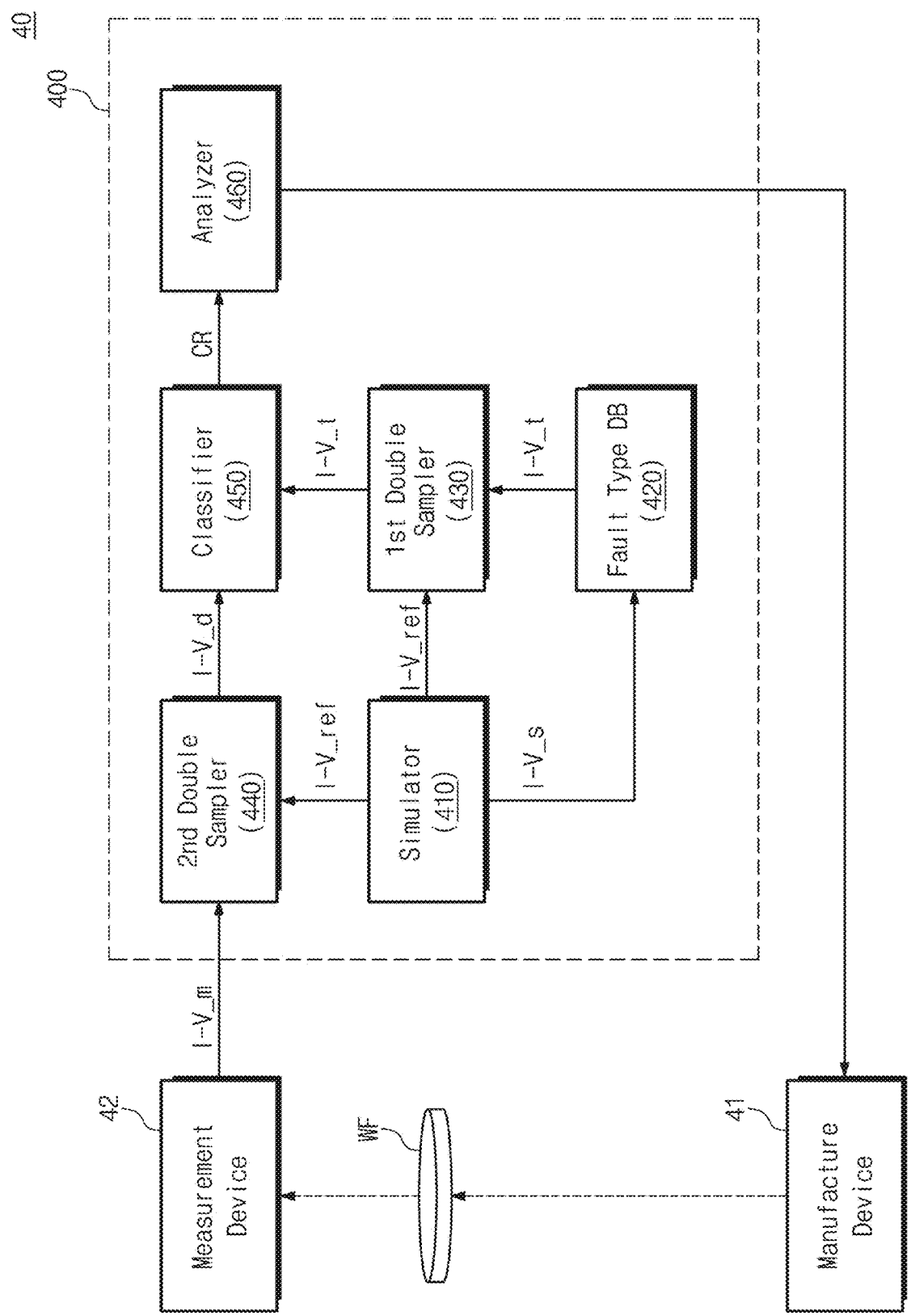
FIG. 12 is a block diagram illustrating a semiconductor fault analysis system according to an example embodiment.

FIG. 12 is a block diagram illustrating a semiconductor fault analysis system according to an example embodiment. Referring to FIG. 12, a semiconductor fault analysis system 40 may include the semiconductor wafer WF, a manufacture device 41, a measurement device 42, and a semiconductor fault analysis device 400. The semiconductor fault analysis device 400 may include a simulator 410, a fault type database 420, first and second double samplers 430 and 440, a classifier 450, and an analyzer 460. Each component of the semiconductor fault analysis system 40 is described above, and thus, additional description will be omitted to avoid redundancy.

As in the semiconductor fault analysis device 100 of FIG. 1, the semiconductor fault analysis device 400 of FIG. 12 may generate various simulation data I-V_s by using the simulator 410. That is, even in the case where data for the pre-training are insufficient or a training model is absent, the reliability of the semiconductor fault analysis device 400 may be secured.

Also, as in the semiconductor fault analysis device 200 of FIG. 6, the semiconductor fault analysis device 400 of FIG. 12 may perform the analysis operation on the double sampling data I-V_d based on the measurement data I-V_m and the reference data I-V_ref, not only based on the measurement data I-V_m. Accordingly, the classification consistency of the semiconductor fault analysis device 400 may be improved.

Figure 13:
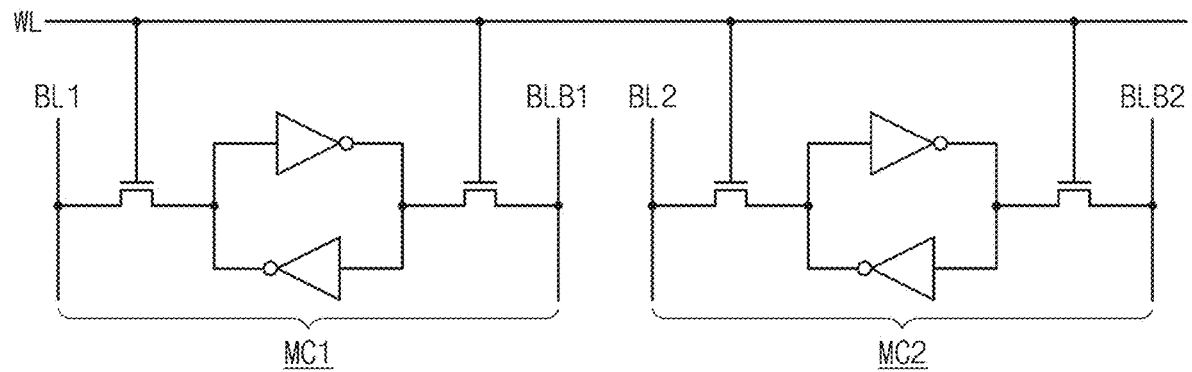
FIG. 13 is a diagram for describing measurement data according to another example embodiment.

FIG. 13 is a diagram for describing measurement data according to another example embodiment. Referring to FIG. 13, the semiconductor wafer WF may include a first memory cell MC1 and a second memory cell MC2 adjacent to the first memory cell MC1. Each of the first and second memory cells MC1 and MC2 has a structure similar to the memory cell MC of FIG. 2, and thus, additional description will be omitted to avoid redundancy.

In an example embodiment, the measurement data I-V_m, the training data I-V_t, and the simulation data I-V_s, which are described above, indicate a current-voltage curve associated with one memory cell MC, but example embodiments are not limited thereto.

For example, in the above example embodiments, measurement data associated with the first memory cell MC1 may be obtained by controlling voltages of a word line WL, a first bit line BL1, and a first complementary bit line BL1B. In contrast, voltages of the word line WL, a second bit line BL2, and a second complementary bit line BL2B connected to the second memory cell MC2 may be controlled for the purpose of obtaining measurement data associated with the first memory cell MC1. That is, a leakage current flowing from the first memory cell MC1 may be obtained as measurement data by driving the second memory cell MC2 (in other words, by driving signal lines connected to the second memory cell MC2). In an example embodiment, as in the above description, a simulator may generate a simulation, and measurement data may be obtained from the generated simulation.

The measurement data I-V_m, the training data I-V_t, and the simulation data I-V_s, which are described with reference to the above example embodiments, are an example for convenience of description, and example embodiments are not limited thereto. Also, fault types of an SRAM device given in the detailed description and drawings are a part of various fault types which may be actually present in SRAM devices, and example embodiments are not limited thereto.

A semiconductor fault analysis device according to example embodiments may perform the analysis operation (or a semiconductor fault type analysis operation) based on the deep neural network algorithm. In this case, the semiconductor fault analysis device may generate a training model by generating simulation data through a simulation associated with various fault types and performing pre-training based on the generated simulation data. Accordingly, even in the case where data for the pre-training are insufficient or a training model is absent, an analysis result of the semiconductor fault analysis device may be more reliable.

Alternatively, the semiconductor fault analysis device according to example embodiments may improve classification consistency by performing an analysis operation on double sampling data which are based on the measurement data and the reference data, not based only on measurement data.

Figure 14:
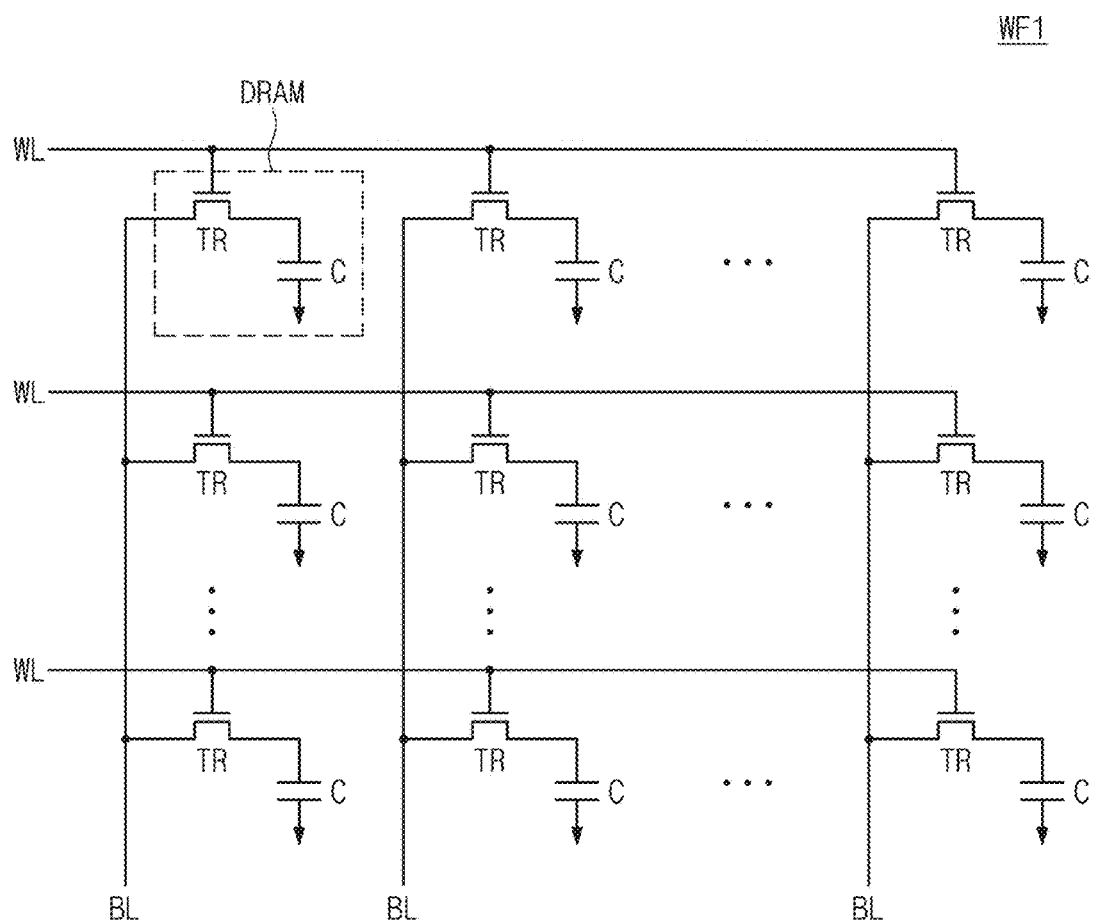
FIG. 14 is a diagram illustrating any one of various semiconductor devices manufactured on a semiconductor wafer according to an example embodiment.

FIG. 14 is a diagram illustrating any one of various semiconductor devices manufactured on a semiconductor wafer according to an example embodiment. Example embodiments in which the semiconductor wafer WF includes an SRAM device are described above, but example embodiments are not limited thereto. For example, as illustrated in FIG. 14, a first semiconductor wafer WF1 may include a DRAM device including DRAM cells DRAM. Each of the DRAM cells DRAM may include an access transistor TR and a storage capacitor "C", and may be connected to the corresponding word line WL and the corresponding bit line BL.

In an example embodiment, a semiconductor fault analysis device may perform fault analysis on the DRAM device included in the first semiconductor wafer WF1, based on the above example embodiments.

For example, the semiconductor fault analysis device may generate a training model by generating a simulation associated with various fault types which may occur in the DRAM device and performing pre-training based on training data from the generated simulation. Alternatively, the semiconductor fault analysis device may generate double sampling data based on electrical data measured from the DRAM device and separate reference data and may perform a fault analysis operation on the generated double sampling data. As such, the reliability of the semiconductor fault analysis device may be improved.

FIG. 15 is a diagram illustrating any one of various semiconductor devices manufactured on a semiconductor wafer according to an example embodiment. Example embodiments in which the semiconductor wafer WF includes an SRAM device or a DRAM device are described above, but example embodiments are not limited thereto. For example, as illustrated in FIG. 15, a second semiconductor wafer WF2 may include a NAND flash memory device including a flash memory.

For example, as illustrated in FIG. 15, the second semiconductor wafer WF2 may include a NAND flash memory block. The NAND flash memory block may include a plurality of cell strings CS11, CS12, CS21, and CS22. The plurality of cell strings CS11, CS12, CS21, and CS22 may be arranged along a row direction and a column direction to form rows and columns.

Each of the plurality of cell strings CS11, CS12, CS21, and CS22 includes a plurality of cell transistors. For example, each of the cell strings CS11, CS12, CS21, and CS22 may include string selection transistor SSTa and SSTb, a plurality of memory cells MC1 to MC8, ground selection transistors GSTa and GSTb, and dummy memory cells DMC1 and DMC2. In an example embodiment, each of the plurality of cell transistors included in the cell strings CS11, CS12, CS21, and CS22 may be a charge trap flash (CTF) memory cell.

In each cell string, the plurality of memory cells MC1 to MC8 may be serially connected and may be stacked in a direction perpendicular to a plane defined by the row direction and the column direction, that is, in a height direction. In each cell string, the string selection transistors SSTa and SSTb may be serially connected and may be interposed between the memory cells MC1 to MC8 and the corresponding one of bit lines BL1 and BL2. The ground selection transistors GSTa and GSTb may be serially connected and may be interposed between the memory cells MC1 to MC8 and a common source line CSL.

In an example embodiment, in each cell string, the first dummy memory cell DMC1 may be interposed between the memory cells MC1 to MC8 and the ground selection transistors GSTa and GSTb. In an example embodiment, in each cell string, the second dummy memory cell DMC2 may be interposed between the memory cells MC1 to MC8 and the string selection transistors SSTa and SSTb.

The ground selection transistors GSTa and GSTb of the cell strings CS11, CS12, CS21, and CS22 may be connected in common to a ground selection line GSL. In an example embodiment, ground selection transistors in the same row may be connected to the same ground selection line, and ground selection transistors in different rows may be connected to different ground selection lines. For example, the first ground selection transistors GSTa of the cell strings CS11 and CS12 in the first row may be connected to a first ground selection line, and the first ground selection transistors GSTa of the cell strings CS21 and CS22 in the second row may be connected to a second ground selection line.

Memory cells of the same height from the substrate or the ground selection transistors GSTa and GSTb are connected in common to the same word line, and memory cells of different heights therefrom are connected to different word lines. For example, the memory cells MC1 to MC8 of the cell strings CS11, CS12, CS21, and CS22 may be connected to first to eighth word lines WL1 to WL8.

String selection transistors, which belong to the same row, from among the first string selection transistors SSTa of the same height are connected to the same string selection line, and string selection transistors belonging to different rows are connected to different string selection lines. For example, the first string selection transistors SSTa of the cell strings CS11 and CS12 in the first row may be connected in common to the string selection line SSL1a, and the first string selection transistors SSTa of the cell strings CS21 and CS22 in the second row may be connected in common to the string selection line SSL2a.

Likewise, string selection transistors, which belong to the same row, from among the second string selection transistors SSTb of the same height may be connected to the same string selection line, and string selection transistors in different rows may be connected to different string selection lines. For example, the second string selection transistors SSTb of the cell strings CS11 and CS12 in the first row may be connected in common to a string selection line SSL1b, and the second string selection transistors SSTb of the cell strings CS21 and CS22 in the second row may be connected in common to a string selection line SSL2b.

In an example embodiment, dummy memory cells of the same height are connected with the same dummy word line, and dummy memory cells of different heights are connected with different dummy word lines. For example, the first dummy memory cells DMC1 are connected to a first dummy word line DWL1, and the second dummy memory cells DMC2 are connected to a second dummy word line DWL2.

As described above, patterns for various semiconductor devices such as a DRAM device, an SRAM device, and a flash memory device may be formed on the semiconductor wafer WF. However, example embodiments are not limited thereto. A semiconductor fault analysis device according to an example embodiment may perform a fault analysis operation on various semiconductor elements or various semiconductor devices.

According to example embodiments, a semiconductor fault analysis device may execute a deep neural network algorithm to automatically classify various fault types occurring on a semiconductor wafer. Even in the case where a training model for a fault analysis operation is absent or data for pre-training are insufficient, the semiconductor fault analysis device according to example embodiments may obtain various simulation data for the pre-training through a simulation.

Alternatively, the semiconductor fault analysis device according to example embodiments may improve consistency of the fault analysis operation by performing the fault analysis operation on double sampling data which are based on measurement data and reference data. Accordingly, the semiconductor fault analysis device with improved reliability and a fault analysis method thereof are provided.

The various operations of methods described above may be performed by any suitable means capable of performing the operations, such as various hardware and/or software component(s), circuits, and/or module(s).

The software may comprise an ordered listing of executable instructions for implementing logical functions, and can be embodied in any "processor-readable medium" for use by or in connection with an instruction execution system, apparatus, or device, such as a single or multiple-core processor or processor-containing system.

The blocks or steps of a method or algorithm and functions described in connection with the example embodiments disclosed herein may be embodied directly in hardware, in a software module executed by a processor, or in a combination of the two. If implemented in software, the functions may be stored on or transmitted over as one or more instructions or code on a tangible, non-transitory computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art.

As is traditional, example embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the example embodiments may be physically separated into two or more interacting and discrete blocks, units and/or modules without departing from the scope of the present disclosure. Further, the blocks, units and/or modules of the example embodiments may be physically combined into more complex blocks, units and/or modules without departing from the scope of the present disclosure.

While example embodiments have been described, it will be apparent to those of ordinary skill in the art that various changes and modifications may be made thereto without departing from the spirit and scope of the present disclosure as set forth in the following claims.

What is claimed is:

1. A fault analysis method of a semiconductor fault analysis device, the fault analysis method comprising:
   receiving measurement data measured from a semiconductor device included in a semiconductor wafer;
   generating double sampling data based on the measurement data and reference data;
   performing a fault analysis operation with respect to the double sampling data;
   classifying a fault type of the semiconductor device based on a result of the fault analysis operation; and
   outputting information about the fault type.

2. The fault analysis method of claim 1, wherein the reference data are data associated with at least one normal current-voltage curve corresponding to a normal state of the semiconductor device, and
   wherein the measurement data are data associated with at least one measured current-voltage curve measured from the semiconductor device.

3. The fault analysis method of claim 1, wherein the double sampling data correspond to a difference between the measurement data and the reference data.

4. The fault analysis method of claim 1, wherein the fault analysis operation is based on a deep neural network algorithm, and
   the fault analysis method further comprises:
   generating training data based on the reference data and fault data associated with each of a plurality of fault types of the semiconductor device; and
   performing pre-training based on the training data to generate a training model for the deep neural network algorithm.

5. The fault analysis method of claim 4, wherein the training data correspond to a difference between the fault data and the reference data.

6. The fault analysis method of claim 4, wherein the fault analysis operation is performed based on the training model.

7. The fault analysis method of claim 4, wherein the fault data are generated from a simulation generated with regard to each of the plurality of fault types.

8. The fault analysis method of claim 7, wherein the simulation is generated based on a simulation program with integrated circuit emphasis.

9. The fault analysis method of claim 1, wherein the measurement data are measured through a design for test terminal of the semiconductor device.

10. The fault analysis method of claim 1, wherein the semiconductor device is a static random access memory.

11. A semiconductor fault analysis device comprising:
    a measurement device configured to measure electrical data from a semiconductor device included in a semiconductor wafer and to output the measured electrical data as measurement data;
    a first double sampler configured to generate double sampling data based on the measurement data and reference data;
    a classifier configured to perform a fault analysis operation based on the double sampling data and classify a fault type of the semiconductor device based on a result of fault analysis operation; and
    an analyzer configured to analyze and output a classification result based on the fault type.

12. The semiconductor fault analysis device of claim 11, wherein the double sampling data correspond to a difference between the measurement data and the reference data.

13. The semiconductor fault analysis device of claim 11, wherein the fault analysis operation is based on a deep neural network algorithm,
the semiconductor fault analysis device further comprises:
a storage having a fault type database, the fault type database indicating fault data associated with a plurality of fault types of the semiconductor device; and
a second double sampler configured to generate training data based on the fault data and the reference data,
wherein the classifier is further configured to generate a training model for executing the fault analysis operation based on the training data.

14. The semiconductor fault analysis device of claim 13, further comprising a simulator configured to generate a simulation for each of the plurality of fault types of the semiconductor device and to measure simulation data from the simulation,
wherein the simulation data are stored to the fault type database as the fault data.

15. The semiconductor fault analysis device of claim 14, wherein the simulator is based on a simulation program with integrated circuit emphasis.

16. The semiconductor fault analysis device of claim 14, wherein the simulator is further configured to:
generate a normal simulation associated with a normal state of the semiconductor device; and
generate the reference data based on the normal simulation.

17. The semiconductor fault analysis device of claim 11, wherein the reference data are output from the measurement device.

18. A semiconductor fault analysis device comprising:
a measurement device configured to receive electrical data from a semiconductor device included in a semiconductor wafer and to output the electrical data as measurement data;
a simulator configured to generate a simulation for each of a plurality of fault types of the semiconductor device and to measure simulation data based on the simulation;
a classifier configured to generate a training model by performing pre-training based on the simulation data, perform a fault analysis operation with respect to the measurement data by using the training model, and classify a fault type of the semiconductor device based on the fault analysis operation; and
an analyzer configured to analyze and output a classification result based on the fault type.

19. The semiconductor fault analysis device of claim 18, wherein the simulator is based on a simulation program with integrated circuit emphasis.

20. The semiconductor fault analysis device of claim 18, wherein the measurement data are data associated with at least one measured current-voltage curve measured from the semiconductor device, and
wherein the simulation data are data associated with at least one simulated current-voltage curve measured from the simulation.

* * * * *